(12) United States Patent
Goyal

(10) Patent No.: US 7,919,435 B2
(45) Date of Patent: Apr. 5, 2011

(54) SUPERCONDUCTOR FILMS WITH IMPROVED FLUX PINNING AND REDUCED AC LOSSES

(75) Inventor: Amit Goyal, Knoxville, TN (US)

(73) Assignee: UT-Battelle, LLC, Oak Ridge, NJ (US)

( * ) Notice: Subject to any disclaimer, the term of this patent is extended or adjusted under 35 U.S.C. 154(b) by 428 days.

(21) Appl. No.: 12/242,021

(22) Filed: Sep. 30, 2008

(65) Prior Publication Data

US 2010/0081574 A1  Apr. 1, 2010

(51) Int. Cl.
*H01L 39/24* (2006.01)
*H01L 39/12* (2006.01)
*H01B 13/00* (2006.01)
*H01B 12/02* (2006.01)

(52) U.S. Cl. ........ 505/320; 505/473; 505/470; 505/237; 505/238; 505/731; 428/698; 428/701; 428/702; 427/62

(58) Field of Classification Search ................... 505/191, 505/230, 236–238, 320, 330, 430, 434, 470, 505/701, 704, 731; 428/698, 701, 702, 357; 427/62, 287, 294, 295; 257/255, 627
See application file for complete search history.

(56) References Cited

U.S. PATENT DOCUMENTS

| | | | |
|---|---|---|---|
| 5,739,086 A | 4/1998 | Goyal et al. | |
| 5,741,377 A | 4/1998 | Goyal et al. | |
| 5,898,020 A | 4/1999 | Goyal et al. | |
| 5,944,966 A | 8/1999 | Suetsugu et al. | |
| 5,958,599 A | 9/1999 | Goyal et al. | |
| 6,150,034 A | 11/2000 | Paranthaman et al. | |
| 6,253,096 B1 | 6/2001 | Balachandran et al. | |
| 6,646,528 B2 | 11/2003 | Ehrenberg et al. | |
| 7,087,113 B2 | 8/2006 | Goyal | |
| 7,258,928 B2 | 8/2007 | Paranthaman et al. | |
| 7,365,271 B2 | 4/2008 | Knoll et al. | |
| 7,381,318 B2 | 6/2008 | Yoo et al. | |
| 7,642,222 B1 * | 1/2010 | Wang et al. | .......... 505/237 |

(Continued)

FOREIGN PATENT DOCUMENTS

EP 0 430 568 B1 6/2001

(Continued)

OTHER PUBLICATIONS

Wang et al, "Microstructure of SrTiO3 buffer layers and its effects on superconducting properties of YBa2Cu3O7-d coated conductors," J. Mater. Res., Jun. 2004, V-19, No. 6, pp. 1869-1875.*

(Continued)

*Primary Examiner* — Stanley Silverman
*Assistant Examiner* — Kallambella Vijayakumar
(74) *Attorney, Agent, or Firm* — Scully, Scott, Murphy and Presser, P.C.

(57) ABSTRACT

The present invention relates to a method for producing a defect-containing superconducting film, the method comprising (a) depositing a phase-separable layer epitaxially onto a biaxially-textured substrate, wherein the phase-separable layer includes at least two phase-separable components; (b) achieving nanoscale phase separation of the phase-separable layer such that a phase-separated layer including at least two phase-separated components is produced; and (c) depositing a superconducting film epitaxially onto said phase-separated components of the phase-separated layer such that nanoscale features of the phase-separated layer are propagated into the superconducting film.

43 Claims, 23 Drawing Sheets

U.S. PATENT DOCUMENTS

2008/0113870 A1     5/2008    Lee et al.
2008/0153709 A1     6/2008    Rupich et al.

FOREIGN PATENT DOCUMENTS

JP            2003-8090       1/2003

OTHER PUBLICATIONS

Written Opinion and International Search Report dated May 10, 2010 received from the Korean Intellectual Property Office.

Barnes, P. N., et al., *IEEE Transactions on Applied Superconductivity*, vol. 15, No. 2, pp. 2827-2830, Jun. 2005.

Daumling, M., et al., "AC loss in superconducting power cables" *Studies of High Temperature Superconductors* : (A. Narlikar, ed.), vol. 33, p. 73, Nova Science Publishers (2000).

Malozemoff, A. P., et al., *Chinese Journal of Physics*, vol. 34 (2-II), pp. 222-231 (Apr. 1996).

Gömöry, F., et al. *Superconductor Science and Technology*, vol. 17, S150-S154 (2004).

Inada, R., "Advancement in Superconducting Material Technology—Advancements in Low AC Loss Technology of Bi-2223 Wire—", Superconductivity Web 21, Jul. 15, 2008, published by International Superconductivity Technology Center, Tokyo, Japan.

An Impressive Patent Portfolio, Internet Article, 2006, 1-3, ORNL Review vol. 39, No. 3, Oakridge National Laboratory.

\* cited by examiner

SUPERCONDUCTOR FILMS WITH IMPROVED FLUX PINNING AND REDUCED AC LOSSES

This invention was made with government support under Contract Number DE-AC05-00OR22725 between the United States Department of Energy and UT-Battelle, LLC. The U.S. government has certain rights in this invention.

FIELD OF THE INVENTION

The present invention relates to high temperature superconductor films, tapes, or wires, and more particularly, to such films, tapes, or wires with reduced AC losses and improved flux-pinning.

BACKGROUND OF THE INVENTION

Superconductors are capable of transmitting electricity with virtually no resistance. Accordingly, in an effort to realize significant energy savings in the use and transport of electricity, there continues to be intense interest is using superconductors in the electric power grid.

All currently known superconductors require a significant degree of temperature lowering to achieve the zero-resistance state. Since the means for temperature lowering amounts to a significant expense, high temperature superconductor (HTS) materials have been of primary interest for commercial application. Some of the first HTS materials are the lanthanum barium copper oxides (LBCO) and the lanthanum strontium copper oxides (LSCO), both types having a transition temperature ($T_c$) less than liquid nitrogen (b.p. of 77 K), e.g., 35 K. Most notable among the HTS materials is yttrium barium copper oxide (YBCO), the first superconductor which achieved superconductivity at 91 K, well above the boiling point of nitrogen of 77 K. Since then, several other HTS materials have been discovered, including the bismuth strontium calcium copper oxides (BSCCO) with $T_c$ up to 107 K, the thallium barium calcium copper oxides (TBCCO) with $T_c$ up to 127 K, and the mercury thallium barium calcium copper oxides with $T_c$ up to 138 K.

Methods for the preparation of films of HTS materials on various substrates are well known. These methods have been instrumental for converting HTS materials into tapes and wires, a necessary step in the effort for integrating these materials as wiring into conventional electrical grid systems and devices. In fact, HTS wires and tapes of significant length are produced by several companies.

The first HTS tapes suffered from unacceptably low critical current densities, a problem caused by poor alignment of grains in the HTS film or coating with grains of the substrate. Several techniques have therefore been developed to fabricate wires or tapes wherein grain alignment is produced. Of particular note is epitaxial growth of superconductors on the Rolling-Assisted-Biaxially-Textured-Substrates (RABiTS). RABiTS substrates typically include a textured metal underlayer (for example, nickel or nickel alloy) and an epitaxial buffer layer (for example, $Y_2O_3$ and/or yttria-stabilized zirconia, YSZ). The development, preparation, and application of RABiTS is disclosed in several references and patents, including, for example, U.S. Pat. Nos. 7,087,113, 5,739,086, 5,741,377, 5,898,020, 5,958,599, and 5,944,966. Epitaxial superconductors on biaxially-textured substrates have significantly improved critical current densities of HTS tapes, and thus, improved utility for commercial applications.

However, HTS tapes and wires operating in the presence of alternating current (AC) suffer from a significant amount of energy dissipation, hereinafter referred to as "AC losses". AC losses arise by several causes. A major contributor to AC loss is hysteretic energy loss in the superconducting oxide film caused by an oscillating external magnetic field. This loss contribution is proportional to the film width. Hence, it has been proposed to divide an FITS film into narrow filaments (i.e., by a filamentization process) to suppress. AC losses. However, the techniques currently known for imparting this filamentization tend to be cumbersome, complex, and expensive. Some examples of these types of techniques include physical scribing, laser scribing, photolithographic patterning, and ink-jet printing of HTS filaments directly onto a textured substrate using MOD solution precursors followed by HTS crystallization. See, for example, Barnes, P. N., et al., *IEEE Transactions on Applied Superconductivity*, Vol. 15, No. 2, June 2005; Daumling, M., et al., *Studies of High Temperature Superconductors*: AC loss in superconducting power cables (A. Narlikar, ed.), pp. 1-39, Nova Science Publishers (2000); Malozemoff, A. P., et al., *Chinese Journal of Physics*, vol. 34 (2-II), pp. 222-231 (April 1996); Gömöry, F., et al. *Superconductor Science and Technology*, vol. 17, S150-S154 (2004); U.S. Pat. No. 6,646,528, and U.S. Application Publication No. 2008/0113870.

There is also a significant interest in increasing the ability of the superconductor to carry supercurrents in the presence of high applied magnetic fields. This is known as increasing the "flux pinning". HTS wires or conductors with good flux-pinning are needed for most large-scale applications in the electric power grid.

SUMMARY OF THE INVENTION

These and other objectives have been achieved by providing an improved and facile method for incorporating nanoscale defects in a superconducting film. The method for incorporating defects can also be extended to incorporate filamentized or plate-like layer structures within the superconducting film. The method utilizes the novel concept of inducing a phase separation of components in a substrate layer (e.g., buffer layer) and depositing a superconducting film on the separated components of the substrate layer in order to attain a superconducting film containing nanoscale defects. In different embodiments, the nanoscale defects can be linear or a filamentized or plate-like morphology. The invention is also directed to superconducting tapes or wires prepared by the inventive method.

In a preferred embodiment, the method includes:
 a. depositing a phase-separable layer epitaxially onto a biaxially-textured substrate, wherein the phase-separable layer includes at least two phase-separable components;
 b. achieving nanoscale phase separation of the phase-separable layer such that a phase-separated layer containing at least two phase-separated components is produced; and
 c. depositing a superconducting film onto the phase-separated components of the phase-separated layer such that nanoscale features (i.e., defects) present in the phase-separated layer propagate into the superconducting film.

The invention advantageously provides a simple and inexpensive method for incorporating nanoscale defects and/or filamentized features into superconducting films, which, in turn, provides superconducting films with increased flux pinning and reduced AC losses. The invention also makes possible the ability to modulate the level of AC loss reduction, flux pinning, and other attributes of the superconducting film by appropriate adjustment of the concentration of phase-separable components.

BRIEF DESCRIPTION OF THE DRAWINGS

FIG. 5b. Theta-2theta X-ray diffraction scan of the phase-separated layer depicted in FIG. 5a.

FIG. 5c. X-ray diffraction phi-scans of MgO, a component of the phase-separated layer depicted in FIG. 5a.

FIG. 5d. X-ray diffraction phi-scans of $LaMnO_3$, a component of the phase-separated layer depicted in FIG. 5a.

FIG. 5f. X-ray diffraction omega-scans or rocking scans of the phase-separated layer depicted in FIG. 5a.

FIG. 6b. A high-resolution scanning Auger map of the surface of the phase-separated layer depicted in FIG. 6a.

FIG. 6c. A cross-sectional TEM image of the phase-separated layer depicted in FIG. 6a.

DETAILED DESCRIPTION OF THE INVENTION

Figure 1A:
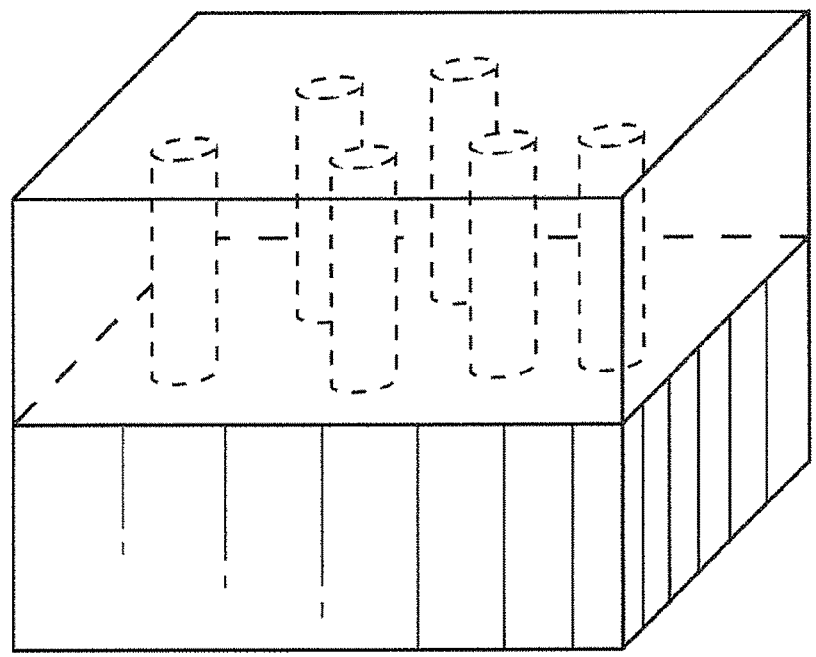
FIG. 1a. Depiction of a phase-separated layer grown epitaxially on a substrate wherein both phases are level and one phase assumes a rod-like morphology.

In the method of the invention, a phase-separable layer is epitaxially deposited onto a biaxially-textured substrate, such as any of the biaxially-textured substrates known in the art, or as further described or referred to below. The phase-separable layer is epitaxially deposited onto the biaxially-textured substrate from a phase-separable composition containing at least two phase-separable components. Before deposition, the phase-separable components are preferably in a single phase in the phase-separable composition. Either during or after deposition onto the biaxially-textured substrate, the phase-separable components separate into different phases such that each component can epitaxially grow onto the substrate.

In one embodiment, the phase-separable components spontaneously separate upon deposition on the surface of the biaxially-textured substrate. The spontaneous separation can be due to any of several factors, including, for example, the conditions of the deposition process (e.g., temperature, pressure, or humidity), or the nature of the substrate. In particular, the substrate upon which the phase-separable components are deposited can influence the ability of the components to phase separate, as well as the manner in which the phase-separable components grow epitaxially on the substrate (e.g., as crystalline, polycrystalline, or amorphous forms, as well as specific epitaxial orientations).

In another embodiment, a post-processing step is employed for inducing phase separation. The post-processing step can be any step known in the art capable of inducing a phase separation of components. A preferred post-processing step is a heating step, more preferably an annealing step. In an annealing step, the phase-separable layer is heated to a temperature sufficient for inducing the separation of components therein (i.e., the "phase separation temperature"). The phase separation temperature is highly dependent on numerous factors, most notably the physical and chemical characteristics of the phase-separable components (e.g., phase change behavior, solubilities, reactivities, crystal growth rates during separation, and so on). Alternatively, components may be induced to separate by cooling the phase-separable layer. For example, the phase-separable layer may be cooled below the lowest temperature at which the components are known to co-exist as a single phase. Other post-processing steps are possible, and can include, for example, radiative (e.g., high energy electromagnetic exposure), ion beam, sonication, or chemical methods for inducing phase-separation.

The components of the phase-separable composition, once separated during or after deposition, need not be of equivalent chemical structure to the components originally present in the phase-separable composition before the deposition process. For example, the components of the phase-separable composition can coexist as an essentially single phase before deposition, but react either with each other, the substrate, a catalyst, or another chemical, which causes the production of a new component not originally present in the phase-separable composition. The new component is either capable of phase separating from the composition itself during or after deposition, and/or causes the separation of one or more other components.

The phase-separable components are at least any two components that are capable of phase-separating into distinct solid phases, during or after deposition, from an essentially single phase of the combined components in the phase-separable composition. The single phase of the combined components can be any suitable state, such as, for example, a melt mixture, vapor mixture, liquid solution, or plasma.

The phase-separable composition preferably possesses the characteristic of behaving as an essentially single phase of the components before deposition and as a separated phase either during or after deposition. The phase-separable composition can be designed on this basis by selecting a combination of components that exhibit such phase separation properties. Methods for determining whether or not a particular combination of components will phase separate in the required manner are well-known in the art. For example, such phase characteristics can be determined by consulting the numerous phase diagrams found in reference textbooks, or by experiment by, for example, heating two or more components of interest in close proximity to each other to observe any indication of a reaction.

The phase-separable components in a phase-separable layer are also preferably known or expected to possess different lattice structures, i.e., are crystallographically mismatched, in their separated state. The significance of the latter characteristic is that crystallographically-mismatched phase-separated components function to transmit (i.e., propagate) the crystallographic mismatching into the subsequently deposited superconducting film. Crystallographic mismatching in different portions of the superconducting film provides defects in the superconducting film which serve to enhance flux pinning and reduce AC losses in the superconducting film.

Figure 1B:
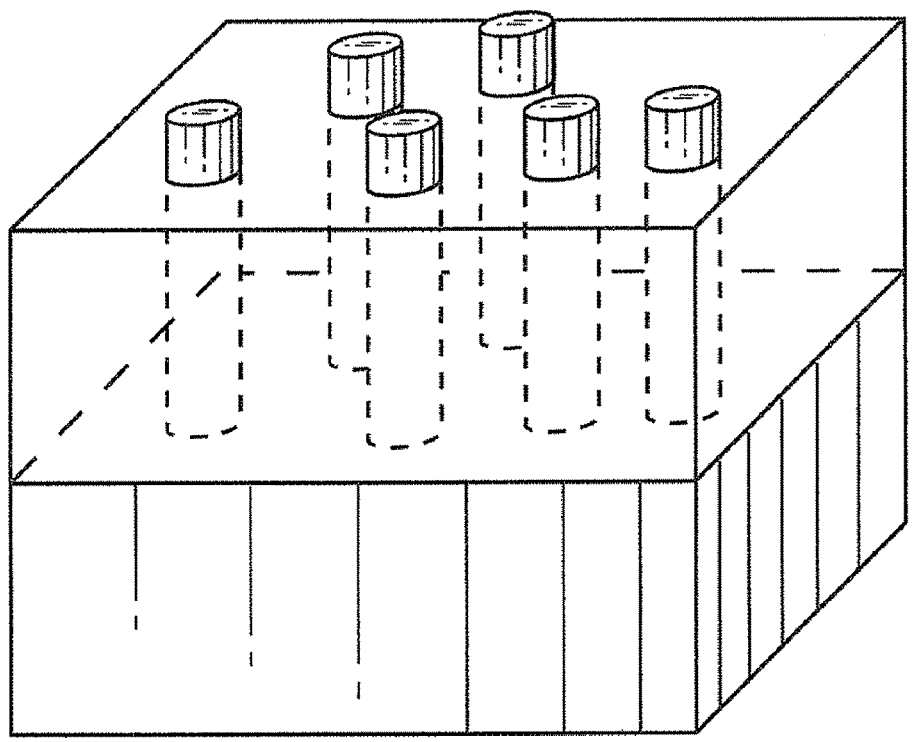
FIG. 1b. Depiction of a phase-separated layer grown epitaxially on a substrate wherein the rod-like phase, as shown in FIG. 1a, extends beyond the other phase or film.
Figure 1C:
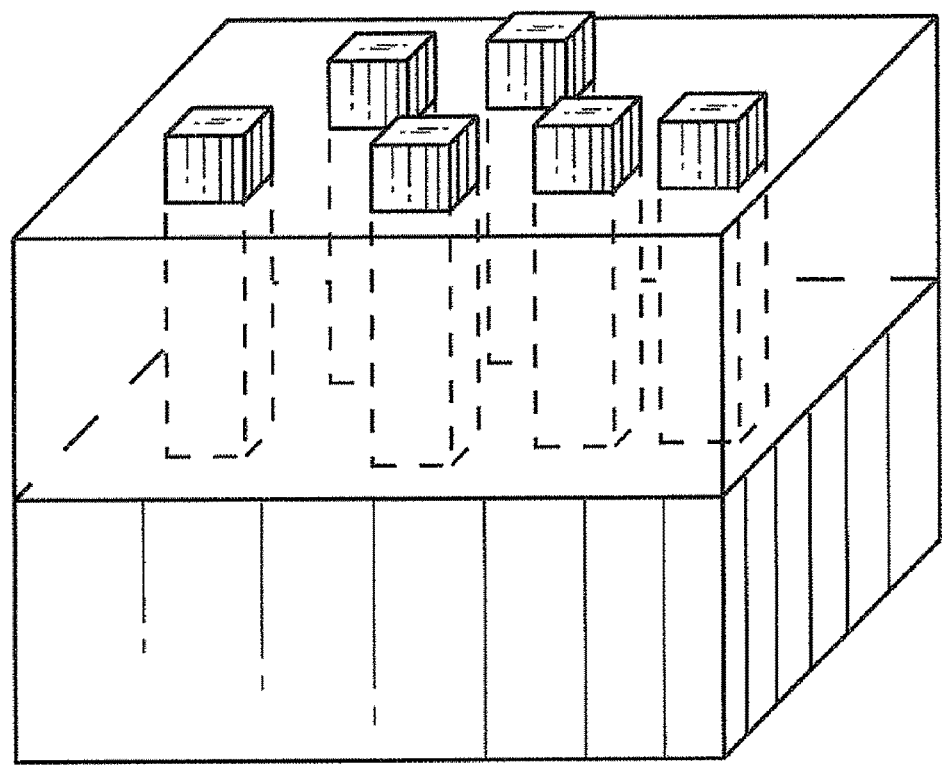
FIG. 1c. Depiction of a phase-separated layer grown epitaxially on a substrate analogous to the situation of FIG. 1b except that the nanorods possess a square morphology.
Figure 1D:
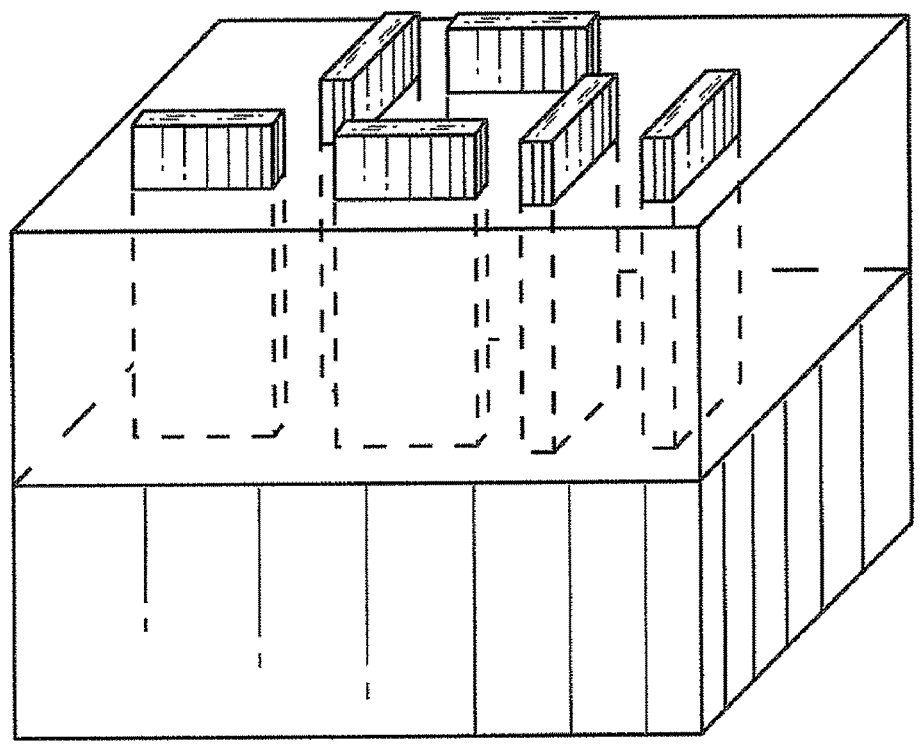
FIG. 1d. Depiction of a phase-separated layer grown epitaxially on a substrate analogous to the situation of FIG. 1b except that the nanorods possess a rectangular morphology.
Figure 2A:
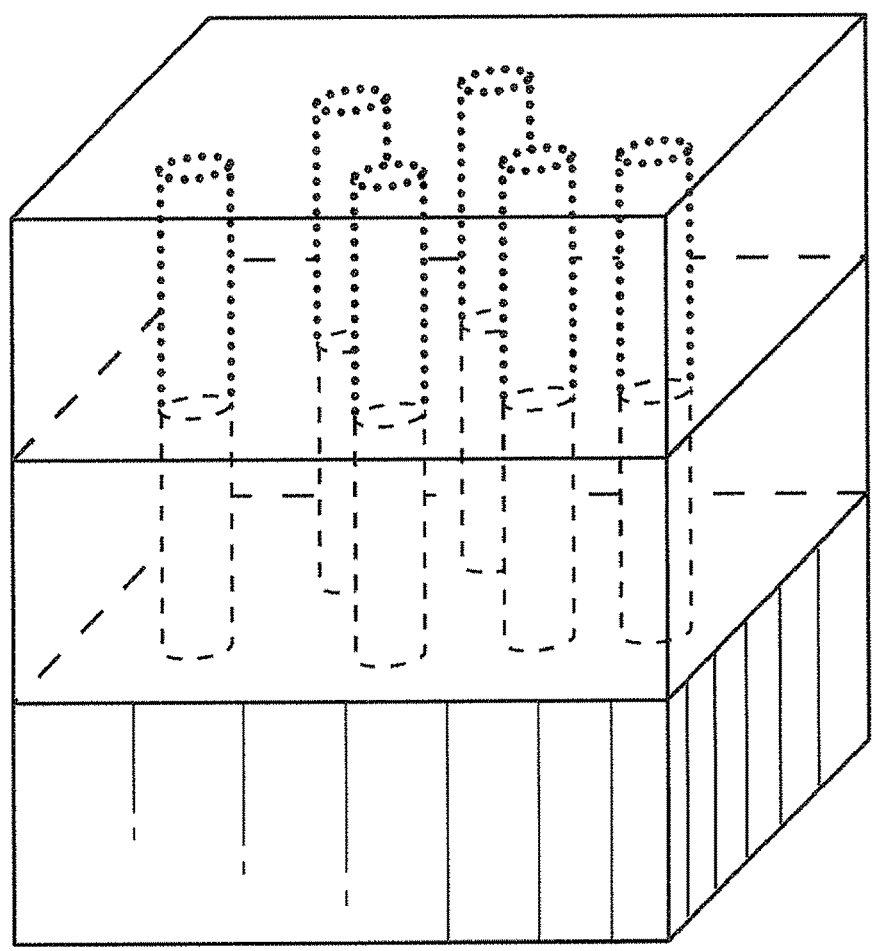
FIG. 2a. An epitaxial YBCO film grown on top of the phase-separated layer depicted in FIG. 1a. The dotted lines in the YBCO layer or film indicate anti-phase boundaries.

For example, FIG. 1a depicts a phase-separated layer grown epitaxially on a biaxially-textured substrate. The columnar structures outlined in dashes indicate nanoscale rods or columns (e.g., nanorods) of one phase-separated component (which, for simplicity, can be designated as the "nanophase component") residing within another phase-separated component (which, for simplicity, can be designated as the "matrix component"). The matrix component is typically the component present in greater abundance, either by weight, surface area, or volume. FIG. 1b depicts a similar situation, except that at least a portion of the nanophase component extends beyond the surface of the matrix component of the film. There is also the possibility that at least a portion of the nanophase component is recessed below the matrix component. Though the shape of the nanophase component in FIGS. 1a and 1b is depicted as cylindrically columnar (i.e., rounded), the indicated nanophase component can be of any shape. For example, as shown in FIGS. 1c and 2a, the nanophase columns may contain edges, e.g., square-columned (FIG. 1c) or rectangular-columned (FIG. 1d). Numerous other morphologies for the nanophase component are possible, including, for example, triangular, pentagonal, hexagonal, or other polygonal columnar shape. Furthermore, a cylindrically columnar shape includes ovoid or extensively flattened cylindrical shapes. Any of these morphologies in the phase-separated layer can be propagated into the superconducting film during deposition of the superconducting film onto the phase-separated layer.

In a preferred method of the invention, a superconducting film with a high-density of linear defects is produced by epitaxially depositing (i.e., growing) a superconducting film onto the phase-separated components of the phase-separated layer described above. As used herein, the term "epitaxially depositing," as used for the superconducting film, means that at least some portion of the superconducting film is epitaxially deposited on the phase-separated components. For example, in a preferred embodiment, at least the matrix component has been epitaxially deposited, whereas the nanophase component (or portions thereof) have been either epitaxially or non-epitaxially deposited.

Figure 2B:
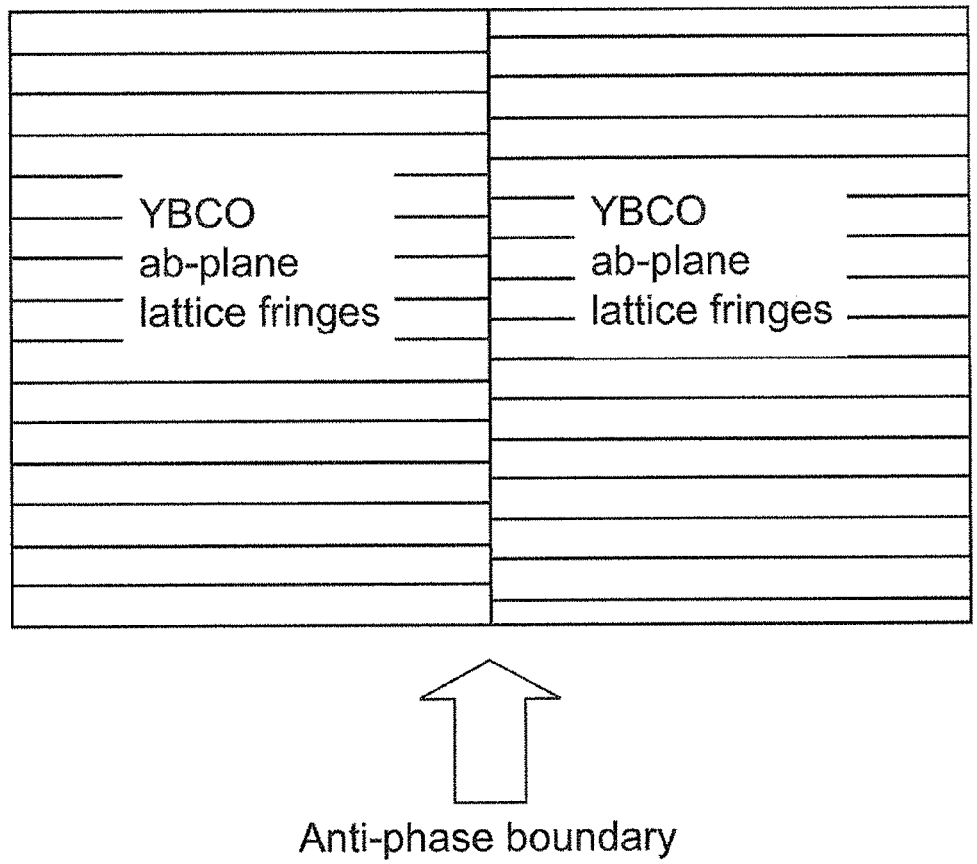
FIG. 2b. Pictorial description of an anti-phase boundary, showing discontinuity of the ab-plane lattice fringes across the boundary.

Antiphase boundaries in the superconducting film arise due to crystallographic mismatching between an epitaxially grown superconducting film on one phase-separated component (e.g., grown on nanophase portions of the phase-separated component) and an epitaxially grown superconducting film on another phase-separated component (e.g., grown on matrix portions of the phase-separated component). The crystallographic mismatching between superconducting film grown on different phase-separated components can be any type of crystallographic mismatching. As understood in the art, and as further shown by FIG. 2b, an anti-phase boundary occurs at the interface of crystalline portions while having the same overall crystallographic orientation. Lattice planes are mismatched across the anti-phase boundary.

Figure 2C:
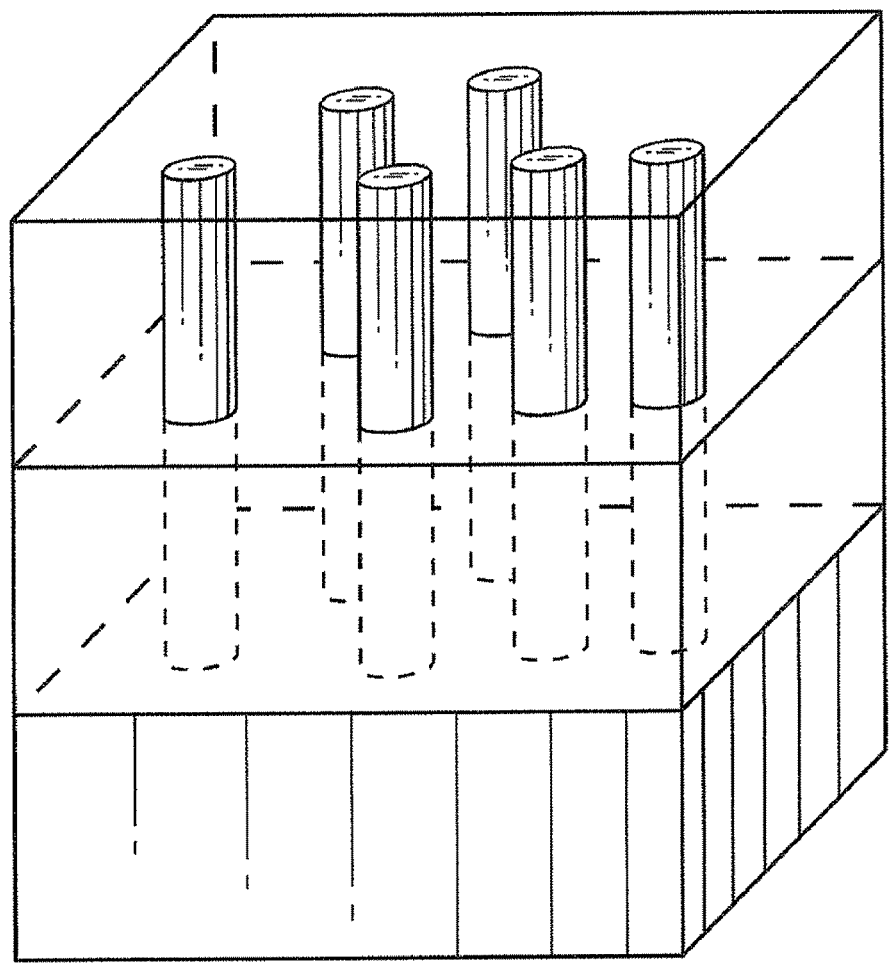
FIG. 2c. Depiction of an epitaxial YBCO film grown on top of the phase-separated layer shown in FIG. 1a, with nanoscale defects propagating into the superconducting film.
Figure 3:
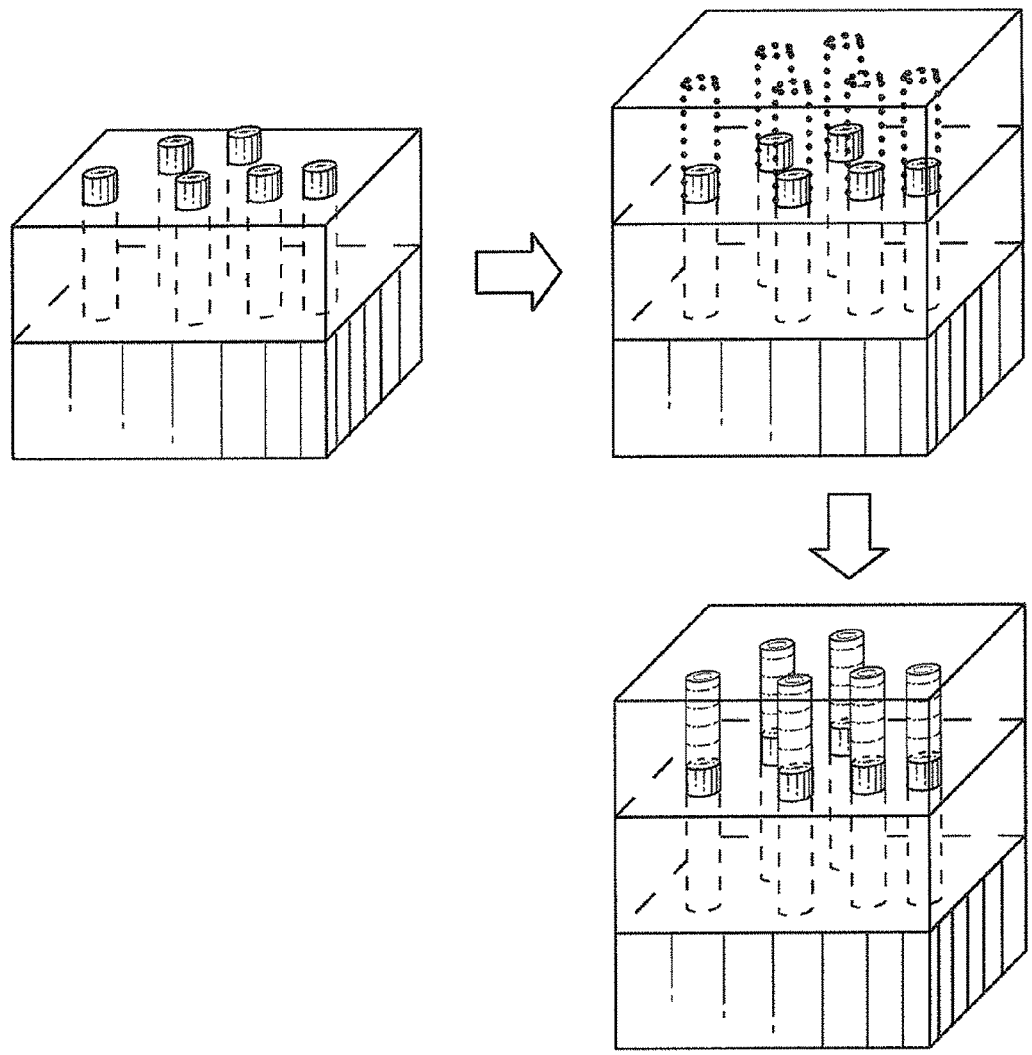
FIG. 3. An epitaxial YBCO film grown on top of the phase-separated layer as shown in FIG. 1b. As shown, the possibilities depicted in FIG. 2a or 2c are applicable to this situation as well.

In other embodiments, as shown in FIG. 2c, the portions of superconducting film grown on different phase-separated components are crystallographically mismatched by being crystallographically different in either orientation or pattern. For example, superconducting film grown on one phase-separated component can be in-plane rotated compared to superconducting film grown on another phase-separated component, or superconducting film grown on one phase-separated component can be polycrystalline while superconducting film grown on another phase-separated component is substantially or completely crystalline, or superconducting film grown on one phase-separated component can be amorphous (i.e., not crystalline or polycrystalline) while superconducting film grown on another phase-separated component is substantially or completely crystalline. In the specific case shown in FIG. 2c, the shaded nanorods in the YBCO layer or film indicate one of in-plane rotated YBCO, polycrystalline YBCO, or amorphous YBCO. FIG. 3 depicts completely analogous possibilities for the case where superconducting film is deposited on a raised or uneven phase-separated surface, such as depicted in FIG. 1b.

As shown in FIG. 2c, the superconducting film grown on the phase-separated layer will contain (as propagated through the superconducting film during growth thereof) the nanoscale features (i.e., morphological features) of the phase-separated layer. The nanoscale features transmitted through the superconducting film function as defects in the superconducting film. For example, since the nanoscale features of the phase-separated layer include crystallographic mismatching between different phases, this crystallographic mismatching will be transmitted through the superconducting film and function as defects therein. Since these features from which defects arise are propagated into the superconducting film during epitaxial or non-epitaxial growth of the superconducting film on the phase-separated layer, the features are generally disposed linearly (for example, as columns) in an orientation generally perpendicular to the surface (or parallel to the direction of film growth). Such defects are hereinafter referred to as linear defects. In this manner, the nanophase portion of the phase-separated layer functions as a template for propagation of linear defects into the superconducting film. However, it is contemplated herein that conditions can be employed which could provide for non-linear (for example, curved) propagation of nanoscale features or defects through the superconducting film. Furthermore, it is contemplated that conditions can be employed which could provide for linearly or non-linearly propagated features to depart from a perpendicular orientation to the surface (for example, within +45 to −45 degrees, +60 to −60 degrees, +80 to −80 degrees, or +85 to −85 degrees from the surface).

The thickness (e.g., width) of the columnar features in the superconducting film arising from the nanophase component of the phase-separated layer is generally of nanoscale dimension, i.e., less than 1 μm thick. For example, in different embodiments, the column thicknesses can be less than 500 nm, or less than 200 nm, or less than 100 nm, or less than 50 nm, or less than 20 nm, or less than 10 nm. However, larger thicknesses of the columnar features are also contemplated, including those having micron-scale features (e.g., up to 1, 5, 10, or 50 microns). However, more typically, the average diameter of the nanoscale defects is in the range of 1-100 nm.

A particularly advantageous aspect of the invention is that characteristics of defects in the superconducting film can be readily and precisely modulated by a corresponding modulation in the phase-separable layer. For example, by adjusting the weight or volume concentrations (i.e., percentages) of phase-separable components ("the components"), the surface density and distribution of phase-separated nanophase portions can be correspondingly adjusted, modulated, or optimized. The percentage of one component in another component can be any desired percentage less than 100%. For example, in different embodiments, the percentage of one component in another component can be about or less than 95%, about or less than 90%, about or less than 80%, about or less than 70%, about or less than 60%, about or less than 50%, and so on. In particular, the percentage of the nanophase component relative to the matrix component can be adjusted. A reduction in the percentage of a nanophase component typically causes a reduction in the density of the nanophase component. Accordingly, the spacing between nanophase features typically increases as the percentage of the nanophase component is reduced. For example, in different embodiments, the percentage of the nanophase component relative to the matrix component can be about or less than 95%, about or less than 90%, about or less than 80%, about or less than 70%, about or less than 60%, about or less than 50%, about or less than 40%, about or less than 30%, about or less than 20%, about or less than 10%, about or less than 5%, about or less than 2%, about or less than 1%, and so on.

Adjustments in the density, distribution, or feature sizes in the phase-separated component can then provide a desired modulation of defects in the subsequently deposited superconducting film. Modulation of defects in the superconducting film can include, for example, an adjustment or optimization of the density, distribution, interspacing, or columnar width, of or between defect features (including filaments) present in the superconducting film. Modulation of defects in the superconducting film can serve to, for example, optimize the extent of AC loss reduction or flux pinning, or the current density value.

In cases where more than one epitaxial orientation of the superconducting film is possible on a phase-separated component, the conditions for the deposition of the superconducting film can be appropriately adjusted such that the superconducting film is deposited on the phase-separated component is in one of the epitaxial orientations and not the other (i.e., one of the epitaxial orientations is favored). The ability to select epitaxial orientations in this manner provides the capability of incorporating numerous other morphological features into the superconducting film beyond what has been described above.

Figure 8:
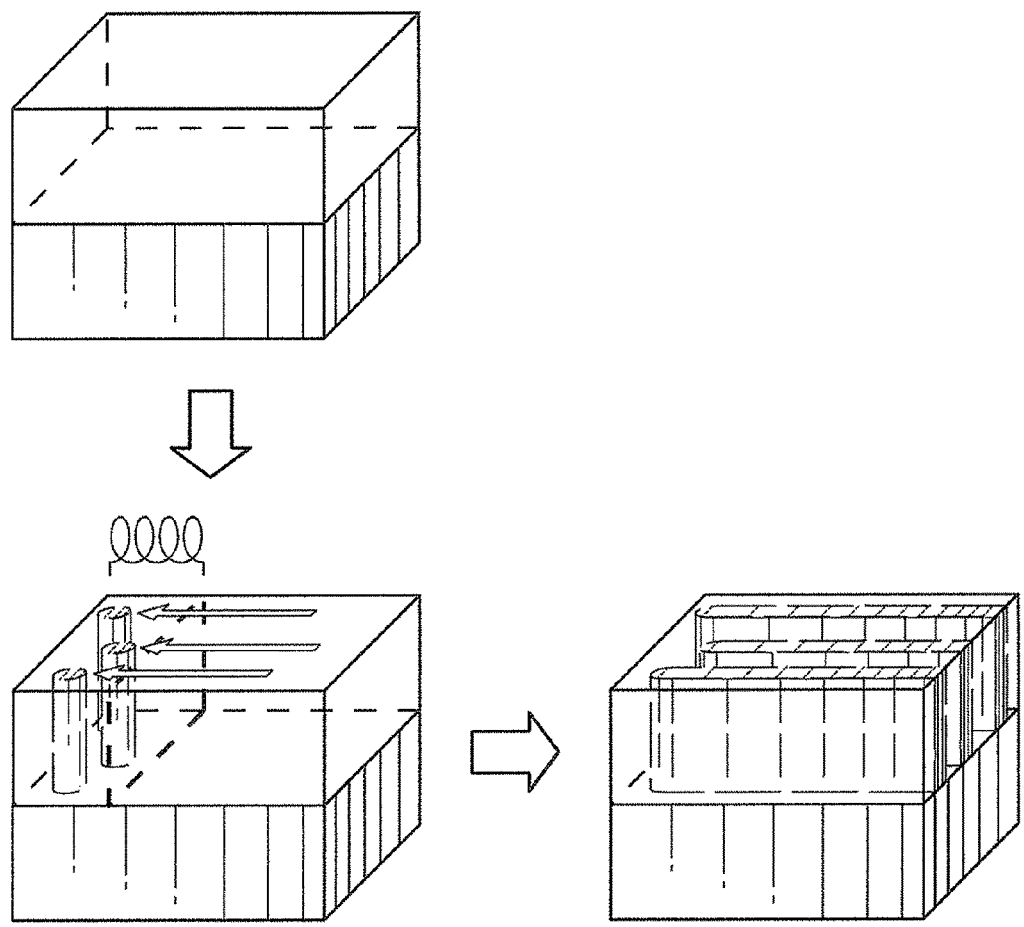
FIG. 8. Depiction of how filamentization can be achieved using a phase separable layer.

In a specific embodiment of the above, the process described above for incorporating linear defects is modified such that the columnar defects are elongated in a direction parallel to the substrate surface such that linearly extended columnar substructures (i.e., plate-like arrays) are produced. In a preferred embodiment, such linearly extended columnar structures are produced by, first, application of an initial seeding process in which, after depositing the phase-separable layer, an edge thereof is selectively phase separated. The seeded phase-separable layer is now induced to phase-separate directionally from the seeded edge, typically in a gradual manner, in a direction away from the seeded edge. The foregoing directional phase-separation process can be accomplished by, for example, conveying the seeded phase-separable layer gradually through an annealing oven (such as by a conveying belt) with the seeded edge entering first. The rate at which the seeded phase-separable layer is conveyed through the oven is appropriately adjusted or optimized such that the phase-separated components of the seeded edge become linearly elongated, thereby resulting in linearly extended columnar structures of the phase-separated components. The foregoing process produces a phase-separated layer containing striations of the phase-separated components. The striated phase-separated layer can be used, completely analogously as the nanophase-matrix type of phase-separated layers, as a template for the deposition of superconducting film. As in the case of the nanophase-matrix type of phase-separated layer, the superconducting film grown on the different phase-separated layers will be crystallographically mismatched, thus providing an elongated columnar (plate-like) defect. FIG. 8 outlines this process and depicts how filamentization can be achieved using a phase-separable layer. Starting from a non-phase-separated precursor film as shown in the top left of the figure, a portion of the film is heated to a temperature to cause the nanoscale phase separation to occur as shown in the bottom left of the figure, and filamentization to occur when the sample is moved through the hot zone with the phase separation occurring preferably on the features nucleated initially (bottom right of figure).

In the method of the invention for producing a defect-incorporated (i.e., "defected") superconducting film, a biaxially-textured substrate is first provided as a substrate on which the phase-separated components are grown. Any of the biaxially-textured substrates known in the art can be used. The term "biaxially-textured substrate" as used herein is meant to be synonymous with the related term "sharply biaxially-textured substrate." By one definition, a biaxially-textured substrate is a polycrystalline substrate wherein the grains are aligned within a specific angular range with respect to one another, as would generally be found on the surface of a bulk single crystal. A polycrystalline material having biaxial texture of sufficient quality for electromagnetic applications can be generally defined as having an x-ray diffraction phi scan peak of no more than 20° full-width-half-maximum (FWHM) and an omega-scan of 10° FWHM. The X-ray phi-scan and omega-scan measure the degree of in-plane and out-of-plane texture, respectively. An example of biaxial texture is the cube texture with orientation {100}<100>, wherein the (100) crystallographic plane of all grains is parallel to the substrate surface and the [100] crystallographic direction is aligned along the substrate length.

Other suitable definitions can also be used for defining a biaxially-textured substrate. For example, a biaxially-textured substrate can be defined as a substrate having a crystallographic orientation such that the substrate possesses a FWHM within 7°, preferably within 5°, and more preferably within 3° throughout the crystal. Furthermore, the biaxially-textured substrate need not be polycrystalline (i.e., multi-grained), but may be single-crystalline (i.e., single-grained).

Several types of biaxially-textured substrates are known, all of which are suitable for the purposes herein. Among them, an important class of substrates are known as rolling assisted, biaxially-textured substrates (RABiTS). The RABiTS method produces a polycrystalline substrate having primarily low angle grain boundaries. Further details of the RABiTS technique and formed substrates can be found in, for example, A. Goyal, et al., *J. of Materials Research*, vol. 12, pgs. 2924-2940, 1997. Rev. B 41, 4038 (1990).

The RABiTS technique provides a simple method for fabricating long lengths of biaxially-textured substrates with primarily low-angle grain boundaries. These substrates have been widely employed for the epitaxial deposition of high temperature superconducting (HTS) materials. A number of U.S. patents directed to the RABiTS process and related process variants have been issued. These include U.S. Pat. Nos. 5,739,086; 5,741,377; 5,846,912; 5,898,020; 5,964,966; 5,958,599; 5,968,877; 6,077,344; 6,106,615; 6,114,287; 6,150,034; 6,156,376; 6,151,610; 6,159,610; 6,180,570; 6,235,402; 6,261,704; 6,270,908; 6,331,199; 6,375,768; 6,399,154; 6,451,450; 6,447,714; 6,440,211; 6,468,591; 6,486,100; 6,599,346; 6,602,313; 6,607,313; 6,607,838; 6,607,839; 6,610,413; 6,610,414; 6,635,097; 6,645,313; 6,537,689; 6,663,976; 6,670,308; 6,675,229; 6,716,795; 6,740,421; 6,764,770; 6,784,139; 6,790,253; 6,797,030; 6,846,344; 6,782,988; 6,890,369; 6,902,600; and 7,087,113, the disclosures of which are incorporated herein by reference in their entireties. Of particular relevance in the above list of patents are U.S. Pat. Nos. 7,087,113, 5,739,086, 5,741,377, 5,898,020, 5,958,599 and 5,944,966.

In a preferred embodiment, a RABiTS substrate is prepared generally as follows. Briefly, a deformed metal substrate with a very well-developed copper-type (Cu-type) rolling texture is first provided. The metal can be any suitable metal, and typically a FCC type of metal (e.g., Cu, Co, Mo, Cd, Pd, Pt, Ag, Al, Ni, and their alloys), and more preferably, nickel and its alloys (e.g., NiW). A substrate with a Cu-type rolling texture can be readily identified as known in the art, and as disclosed in, for example, U.S. Pat. No. 7,087,113. For example, a Cu-type rolling texture generally exhibits the characteristic that the X-ray intensity in the pole figures is concentrated on the β-fiber in Euler space of orientation representation. In other words, a Cu-type rolling texture is generally characterized by an orientation of all the grains in the material lying on the β-fiber. The β-fiber is defined as the tube or fiber running from the B through the S to the C point in Euler space. Cu-type rolling texture is generally best shown using pole figures of (111), (200), and (220) from the substrate or drawing the orientations in Euler Space. Next, the metal with Cu-type rolling texture is annealed at a temperature higher than its secondary recrystallization temperature to provide exaggerated grain growth such that a single grain consumes other grains to form an essentially single crystalline (i.e., single grain) type of material (hereinafter, a "single crystal substrate").

Typically, at least one buffer layer is epitaxially deposited on the surface of the single crystal substrate. The function of the buffer layer is typically as a chemical barrier between the single crystal substrate and the superconducting layer, thereby preventing reaction between these layers while epitaxially transmitting the ordered crystalline structure of the single crystal substrate to the superconducting layer. Some examples of buffer layers include $CeO_2$, yttria-stabilized zirconia (YSZ), $(RE)_2O_3$, wherein RE can be any of the metals already defined above (e.g., $Y_2O_3$), LaM'O3, wherein M' is a transition or main group metal (e.g., $LaAlO_3$, $LaGaO_3$, $LaMnO_3$, $LaCrO_3$, $LaNiO_3$), lanthanum zirconate (e.g., $La_2Zr_2O_7$), $SrTiO_3$ (and its Nb-doped analog), $NdGaO_3$, $NbTiO_3$, MgO, TiN, $TiB_2$, Pd, Ag, Pt, and Au.

Another example of a biaxially-textured substrate are the ion-beam-assisted deposition (IBAD) substrates. IBAD processes and resulting substrates are described in, for example, U.S. Pat. Nos. 6,632,539, 6,214,772, 5,650,378, 5,872,080, 5,432,151, 6,361,598, 5,872,080, 6,756,139, 6,884,527, 6,899,928, and 6,921,741, the disclosures of which are incorporated herein by reference in their entireties.

Yet another example of a biaxially-textured substrate are the inclined-substrate deposition (ISD) substrates. In the ISD process, the resulting substrate has rotated cube texture and the rotation can be as high as 40-45°. ISD processes and resulting substrates are described in, for example, U.S. Pat. Nos. 6,190,752 and 6,265,353, the disclosures of which are incorporated herein by reference in their entireties.

In both the IBAD and ISD processes, a biaxially-textured layer is deposited on a flexible, polycrystalline, untextured substrate.

The phase-separable components deposited on the biaxially-textured substrate can be selected from any of the known classes of solid-phase compounds or materials, e.g., oxides, nitrides, carbides, borides, phosphides, sulfides, silicides, aluminides, stannides, antimonides, selenides, tellurides, niobides, germanides, and so on, of any element. The element can be, for example, an alkali, alkaline earth, transition, main group (e.g., boron, carbon, nitrogen, oxygen, and halide groups of the Periodic Table), lanthanum, or actinide element. One or more of the components can also be an elemental form of any element of the Periodic Table (e.g., the zerovalent form of aluminum, copper, silver, gold, palladium, platinum, rhodium, or tin).

In a particular embodiment, at least one of the phase-separable components is a metal oxide compound or material. The metal in the metal oxide can be any one or a combination of metals. The metal in the oxide can be, for example, an alkali, alkaline earth, transition, main group, lanthanum, or actinide metal.

In a first embodiment, at least one of the phase-separable components is an alkali metal oxide. Some examples of alkali metal oxides include lithium oxide and sodium oxide. The corresponding alkali metal sulfides, selenides, and tellurides are also applicable herein.

In a second embodiment, at least one of the phase-separable components is an alkaline earth metal oxide. Some examples of alkali metal oxides include magnesium oxide (MgO), calcium oxide (CaO), strontium oxide (SrO), and barium oxide (BaO). The corresponding alkaline earth sulfides, selenides, and tellurides are also applicable herein. The alkaline earth halides (e.g., $CaF_2$) are also applicable.

In a third embodiment, at least one of the phase-separable components is a main group metal oxide. Some examples of main group metal oxides include the boron oxides (e.g., $B_2O_3$ and its different forms), aluminum oxides (e.g., $Al_2O_3$ and its different forms), gallium oxides (e.g., $Ga_2O_3$), indium oxides (e.g., $In_2O_3$ and indium tin oxide (ITO)), silicon oxides (e.g., $SiO_2$ and its different forms), germanium oxides (e.g., $GeO_2$ and GeO), tin oxides (e.g., $SnO_2$ and SnO), lead oxides (e.g., $PbO_2$ and PbO), phosphorus oxides (e.g., $P_2O_5$), arsenic oxides (e.g., $As_2O_3$), antimony oxides (e.g., $SbO_2$ or $Sb_2O_4$), bismuth oxides (e.g., $Bi_2O_3$ and its different forms), selenium oxides (e.g., $SeO_2$), tellurium oxides (e.g., $TeO_2$). The corresponding main group metal sulfides, selenides, and tellurides are also applicable herein.

In a fourth embodiment, at least one of the phase-separable components is a transition metal oxide. Some examples of transition metal oxides include the scandium oxides (e.g., $Sc_2O_3$ (scandia)), yttrium oxides (e.g., yttria ($Y_2O_3$) and yttria-containing materials), titanium oxides (e.g., TiO, $TiO_2$, and $Ti_2O_3$), zirconium oxides (e.g., $ZrO_2$ (zirconia)), hafnium oxides ($HfO_2$), vanadium oxides (e.g., $V_2O_5$, VO, $VO_2$, $V_2O_3$, $V_3O_7$, $V_4O_9$, and $V_6O_{13}$), niobium oxides (e.g., NbO, $NbO_2$, $Nb_2O_5$), tantalum oxides (e.g., $Ta_2O_5$), chromium oxides (e.g., $Cr_2O_3$ and $CrO_2$), molybdenum oxides (e.g., $MoO_3$ and $MoO_2$), tungsten oxides (e.g., $W_2O_3$, $WO_2$, $WO_3$), manganese oxides (e.g., MnO, $Mn_3O_4$, $Mn_2O_3$, and $MnO_2$), rhenium oxides (e.g., $ReO_2$, $ReO_3$, and $Re_2O_7$), iron oxides (e.g., $Fe_2O_3$ and its different forms, FeO, and $Fe_3O_4$), ruthenium oxides (e.g., $RuO_2$), cobalt oxides (e.g., CoO and $CO_3O_4$), rhodium oxide, iridium oxide, nickel oxides (e.g., NiO), palladium oxide, platinum oxide, copper oxides ($Cu_2O$ and CuO), silver oxide ($Ag_2O$), zinc oxide (ZnO), and cadmium oxide (CdO). The corresponding transition metal sulfides, selenides, and tellurides are also applicable herein. In addition, the borides, aluminides, gallides, carbides, silicides, germanides, stannides, nitrides, phosphides, arsenides, antimonides, bismuthides, and halides (e.g., fluorides, chlorides, bromides, or iodides) of any of the transition metals, particularly the foregoing listed transition metals, are applicable herein.

In a fifth embodiment, at least one of the phase-separable components is a rare earth metal compound or material, such as a lanthanide or actinide compound or material. More commonly, the rare earth metal component is a rare earth metal oxide. A particularly common class of the rare earth metal oxides are those of the general formula $(RE)_2O_3$, wherein RE is preferably a rare earth lanthanide or actinide metal. Some examples of rare earth metals which can substitute for RE in the foregoing formula include yttrium (Y), lanthanum (La), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and thorium (Th). Other rare earth metal oxides include those based on the general formulas (RE)O or $(RE)O_2$, e.g., $CeO_2$ (ceria). The corresponding rare earth metal sulfides, selenides, and tellurides are also applicable herein. The rare earth metal halides (e.g., fluorides, chlorides, bromides, or iodides) of the rare earth metals are also applicable herein.

In a sixth embodiment, at least one of the phase-separable components is a perovskite-type oxide according to the chemical formula:

$$M'M''O_3 \qquad (1)$$

In formula (1), M' and M'' are independently monovalent, divalent, trivalent, tetravalent, or pentavalent metal ions, provided that the sum of oxidation states of M' and M'' add to +6 to charge balance with oxide atoms. For example, M' can be a monovalent metal ion and M'' a pentavalent metal ion, or M' can be a divalent metal ion and M'' a tetravalent metal ion, or M' and M'' can both be trivalent metal ions. Some examples of perovskite-type materials wherein M' is a monovalent metal ion and M'' is a pentavalent metal ion include $LiNbO_3$, $LiTaO_3$, $NaNbO_3$, $NaTaO3$, $CuNbO_3$, $CuTaO_3$, $AgNbO_3$, and $AgTaO_3$. Some examples of perovskite-type materials wherein M' is a divalent metal ion and M'' is a tetravalent metal ion include the zirconates (e.g., $MgZrO_3$, $CaZrO_3$, $SrZrO_3$, $BaZrO_3$, $FeZro_3$, $CoZrO_3$, $NiZrO_3$, $ZnZrO_3$, $PbZrO_3$, and $CdZrO_3$), the titanates (i.e., of the general formula $M'TiO_3$ wherein M' is a divalent metal ion, e.g., $MgTiO_3$, $CaTiO_3$, $SrTiO_3$, $BaTiO_3$, $FeTiO_3$, $CoTiO_3$, $NiTiO_3$, $ZnTiO_3$, $PbTiO_3$, and $CdTiO_3$), $PbIrO_3$, $PbNbO_3$, the cerates (e.g., $MgCeO_3$, $CaCeO_3$, $SrCeO_3$, $BaCeO_3$, $FeCeO_3$, $CoCeO_3$), $MgWO_3$, $CaWO_3$, $FeWO_3$, $MgRuO_3$, $CaRuO_3$, $SrRuO_3$, $BaRuO_3$, and the metasilicates (e.g., $MgSiO_3$, $CaSiO_3$, $SrSiO_3$, $BaSiO_3$, $FeSiO_3$, $CoSiO_3$, $NiSiO_3$, $ZnSiO_3$, $PbSiO_3$, and $CdSiO_3$). Some examples of perovskite-type materials wherein M' and M'' are both trivalent metal ions include materials of the general formula $LaM''O_3$, wherein M'' is a trivalent metal ion (e.g., $LaCrO_3$, $LaMnO_3$, $LaFeO_3$, $LaCoO_3$, $LaNiO_3$, $LaVO_3$, $LaAlO_3$, $LaGaO_3$, $LaNbO_3$, $LaTaO_3$, $LaGdO_3$, and $LaTmO_3$), $YCrO_3$, $YMnO_3$, $YFeO_3$, $YCoO_3$, $YNiO_3$, $YVO_3$, $YAlO_3$, $YGaO_3$, $YGdO_3$, $YbCrO_3$, $DyCrO_3$, $NdCrO_3$, $SmCrO_3$, $NdVO_3$, $TbVO_3$, $EuNbO_3$, $GdFeO_3$, $SmMn03$, $CdMnO_3$, $YbMnO_3$, $DyMnO_3$, $NdMnO_3$, and $NiMnO_3$. The corresponding perovskite-type sulfides, selenides, and tellurides are also applicable herein.

In a seventh embodiment, at least one of the phase-separable components is a spinel-type oxide according to the formula $$M'M''2O_4 \qquad (2)$$

In formula (2), M' and M'' are independently monovalent, divalent, trivalent, tetravalent, pentavalent, or hexavalent metal ions, provided that the sum of oxidation states of M' and M'' add to +8 to charge balance with oxide atoms. For example, M' can be a divalent metal ion and M'' a trivalent metal ion, or M' can be a tetravalent metal ion and M'' a divalent metal ion. The corresponding spinel-type sulfides, selenides, and tellurides are also applicable herein.

Some examples of spinel-type materials according to formula (2) wherein M' is a divalent metal ion and M'' a trivalent metal ion include materials of the general formula $M'V_2O_4$ wherein M' is a divalent metal (e.g., $MnV_2O_4$, $FeV_2O_4$, $CoV_2O_4$, $NiV_2O_4$, $CuV_2O_4$, $ZnV_2O_4$, $CdV_2O_4$, $MgV_2O_4$, $CaV_2O_4$, $SrV_2O_4$, $BaV_2O_4$, and $PbV_2O_4$), materials of the general formula $M'Cr_2O_4$ wherein M' is a divalent metal (e.g., $MnCr_2O_4$, $FeCr_2O_4$, $CoCr_2O_4$, $NiCr_2O_4$, $CuCr_2O_4$, $ZnCr_2O_4$, $CdCr_2O_4$, $MgCr_2O_4$, $CaCr_2O_4$, $SrCr_2O_4$, $BaCr_2O_4$, and $PbCr_2O_4$), materials of the general formula $M'Mn_2O_4$ wherein M' is a divalent metal (e.g., $FeMn_2O_4$, $CoMn_2O_4$, $NiMn_2O_4$, $CuMn_2O_4$, $ZnMn_2O_4$, $CdMn_2O_4$, $MgMn_2O_4$, $CaMn_2O_4$, $SrMn_2O_4$, $BaMn_2O_4$, $TiMn_2O_4$, and $PbMn_2O_4$), materials of the general formula $M'Fe_2O_4$ wherein M' is a divalent metal (e.g., $MnFe_2O_4$, $CoFe_2O_4$, $NiFe_2O_4$, $CuFe_2O_4$, $ZnFe_2O_4$, $CdFe_2O_4$, $MgFe_2O_4$, $CaFe_2O_4$, $SrFe_2O_4$, $BaFe_2O_4$, $TiFe_2O_4$, and $PbFe_2O_4$), materials of the general formula $M'CO_2O_4$ wherein M' is a divalent metal (e.g., $MnCO_2O_4$, $NiCO_2O_4$, $CuCO_2O_4$, $ZnCO_2O_4$, $CdCO_2O_4$, $MgCO_2O_4$, $CaCO_2O_4$, $SrCO_2O_4$, $BaCO_2O_4$, $TiCO_2O_4$, and $PbCO_2O_4$), materials of the general formula $M'Ni_2O_4$ wherein M' is a divalent metal (e.g., $MnNi_2O_4$), materials of the general formula $MS_2O_4$ wherein M' is a divalent metal (e.g., $MnB_2O_4$, $NiB_2O_4$, $CuB_2O_4$, $ZnB_2O_4$, $CdB_2O_4$, $MgB_2O_4$, $CaB_2O_4$, $SrB_2O_4$, $BaB_2O_4$, $TiB_2O_4$, and $PbB_2O_4$), materials of the general formula $M'Al_2O_4$ wherein M' is a divalent metal (e.g., $MnAl_2O_4$, $NiAl_2O_4$, $CuAl_2O_4$, $ZnAl_2O_4$, $CdAl_2O_4$, $MgAl_2O_4$, $CaAl_2O_4$, $SrAl_2O_4$, $BaAl_2O_4$, $TiAl_2O_4$, and $PbAl_2O_4$), materials of the general formula $M'Ga_2O_4$ wherein M' is a divalent metal (e.g., $MnGa_2O_4$, $NiGa_2O_4$, $CuGa_2O_4$, $ZnGa_2O_4$, $CdGa_2O_4$, $MgGa_2O_4$, $CaGa_2O_4$, $SrGa_2O_4$, $BaGa_2O_4$, $TiGa_2O_4$, and $PbGa_2O_4$), materials of the general formula $M'In_2O_4$ wherein M' is a divalent metal (e.g., $MnIn_2O_4$, $NiIn_2O_4$, $CuIn_2O_4$, $ZnIn_2O_4$, $CdIn_2O_4$, $MgIn_2O_4$, $CaIn_2O_4$, $SrIn_2O_4$, $BaIn_2O_4$, $TiIn_2O_4$, and $PbIn_2O_4$), and materials of the general formula $M'(RE)_2O_4$ wherein M' is a divalent metal and RE is a rare earth lanthanide or actinide trivalent metal, and more particularly, the general formula $M'La_2O_4$ wherein M' is a divalent metal (e.g., $MnLa_2O_4$, $NiLa_2O_4$, $CuLa_2O_4$, $ZnLa_2O_4$, $CdLa_2O_4$, $MgLa_2O_4$, $CaLa_2O_4$, $SrLa_2O_4$, $BaLa_2O_4$, and $TiLa_2O_4$, $PbLa_2O_4$). M' and M" can also represent a combination of metals, such as in $(Fe, Mg)Cr_2O_4$, $(Fe, Mg)Cr_2O_4$, and $(Ba_{0.08}Cu_{0.9})_2Cr_2O_4$.

Some examples of spinel-type materials according to formula (2) wherein Mt is a tetravalent metal ion and M" a divalent metal ion include $SiMg_2O_4$, $SiNi_2O_4$, $SiZn_2O_4$, $SiCu_2O_4$, $ZrMg_2O_4$, $ZrNi_2O_4$, $ZrZn_2O_4$, and $ZrCu_2O_4$.

In an eighth embodiment, the phase-separable layer includes at least two components independently selected from any of the metal oxide, sulfide, selenide, and telluride compounds or materials described above. Some examples of combinations of these classes of components include, for example, two metal oxide components, one metal oxide and one metal sulfide component, two metal sulfide components, one metal oxide and one metal selenide component, two selenide components, one metal oxide and one metal telluride component, one metal sulfide and one metal selenide component, and so on.

In a ninth embodiment, the phase-separable layer includes at least two metal oxide components independently selected from any of the metal oxide components described above.

In a tenth embodiment, the phase-separable layer includes at least two metal oxide components selected from alkali metal oxides wherein the at least two alkali metal oxides can be induced to phase separate.

In an eleventh embodiment, the phase-separable layer includes at least two metal oxide components selected from alkaline earth metal oxides wherein the at least two alkaline earth metal oxides can be induced to phase separate.

In a twelfth embodiment, the phase-separable layer includes at least one metal oxide component selected from alkali metal oxides and at least one metal oxide component selected from alkaline earth metal oxides, wherein the two components can be induced to phase separate.

In a thirteenth embodiment, the phase-separable layer includes at least one metal oxide component selected from alkali metal oxides and at least one metal oxide component selected from transition metal oxides, wherein the two components can be induced to phase separate.

In a fourteenth embodiment, the phase-separable layer includes at least one metal oxide component selected from alkaline earth metal oxides and at least one metal oxide component selected from transition metal oxides, wherein the two components can be induced to phase separate.

In a fifteenth embodiment, the phase-separable layer includes at least one metal oxide component selected from alkali metal oxides and at least one metal oxide component selected from rare earth metal oxides, wherein the two components can be induced to phase separate.

In a sixteenth embodiment, the phase-separable layer includes at least one metal oxide component selected from alkaline earth metal oxides and at least one metal oxide selected from rare earth metal oxides, wherein the two components can be induced to phase separate.

In a seventeenth embodiment, the phase-separable layer includes at least one metal oxide component selected from transition metal oxides and at least one metal oxide selected from rare earth metal oxides, wherein the two components can be induced to phase separate. For example, the transition metal oxide can be yttria-stabilized zirconia (YSZ) and the rare earth metal oxide can be $CeO_2$.

In an eighteenth embodiment, the phase-separable layer includes at least two metal oxide components selected from the perovskite-type metal oxides according to formula (1) above.

In a nineteenth embodiment, the phase-separable layer includes at least two metal oxide components selected from the spinel-type metal oxides according to formula (2) above.

In a twentieth embodiment, the phase-separable layer includes at least one metal oxide component selected from alkali metal oxides and at least one metal oxide component selected from perovskite-type metal oxides according to formula (1) above.

In a twenty-first embodiment, the phase-separable layer includes at least one metal oxide component selected from alkali metal oxides and at least one metal oxide selected from spinel-type metal oxides according to formula (2) above.

In a twenty-second embodiment, the phase-separable layer includes at least one metal oxide component selected from alkaline earth metal oxides and at least one metal oxide selected from perovskite-type metal oxides according to formula (1) above.

In a specific embodiment of the twenty-second embodiment, at least one alkaline earth metal oxide component is combined with at least one perovskite-type metal oxide component according to formula (1) wherein, in the formula $M'M"O_3$ of formula (1), M' is a divalent metal ion and M" is a tetravalent metal ion. In a more specific embodiment, at least one alkaline earth metal oxide component is combined with at least one perovskite-type metal oxide component according to the subformula $M'TiO_3$ wherein M' is a divalent metal ion. In a more specific embodiment, at least one alkaline earth metal oxide component is combined with at least one perovskite-type metal oxide component according to the subformula $M'TiO_3$ wherein M' is an alkaline earth metal ion. In a more specific embodiment, at least one alkaline earth metal oxide component is combined with a perovskite-type metal oxide component of formula $BaTiO_3$. In more specific embodiments, the alkaline earth metal oxide component is MgO for any of the specific embodiments enumerated above.

In another specific embodiment of the twenty-second embodiment, at least one alkaline earth metal oxide component is combined with at least one perovskite-type metal oxide component according to formula (1) wherein, in the formula $M'M"O_3$ of formula (1), M' and M" are both trivalent metal ions. In a more specific embodiment, at least one alkaline earth metal oxide component is combined with at least one perovskite-type metal oxide component according to the subformula $(RE)M"O_3$ wherein RE is a rare earth trivalent metal ion selected from any of the rare earth metals described above. In a more specific embodiment, at least one alkaline earth metal oxide component is combined with at least one perovskite-type metal oxide component according to the subformula $LaM"O_3$ wherein M" is a trivalent metal ion. In a more specific embodiment, at least one alkaline earth metal oxide component is combined with at least one perovskite-type metal oxide component according to the subformula $LaM"O_3$ wherein M" is a trivalent transition metal ion. In a more specific embodiment, at least one alkaline earth metal oxide component is combined with a perovskite-type metal oxide component of formula $LaMnO_3$. In more specific embodiments, the alkaline earth metal oxide component is MgO for any of the specific embodiments enumerated above.

In a twenty-third embodiment, the phase-separable layer includes at least one metal oxide component selected from alkaline earth metal oxides and at least one metal oxide selected from spinel-type metal oxides according to formula (2) above. In a more specific embodiment, at least one alkaline earth metal oxide component is combined with at least one spinel-type metal oxide component according to formula (2) wherein, in the formula $M'M''_2O_4$ of formula (2), M' is a divalent metal ion and M" is a trivalent metal ion. In a more specific embodiment, at least one alkaline earth metal oxide component is combined with at least one spinel-type metal oxide component according to the subformula $M'Fe_2O_4$ wherein M' is a divalent metal ion. In a more specific embodiment, at least one alkaline earth metal oxide component is combined with at least one spinel-type metal oxide component of formula $CoFe_2O_4$. In more specific embodiments, the alkaline earth metal oxide component is MgO for any of the specific embodiments enumerated above.

In a twenty-fourth embodiment, the phase-separable layer includes at least one metal oxide component selected from the perovskite-type metal oxides according to formula (1) and at least one metal oxide component selected from the spinel-type metal oxides according to formula (2).

In a specific embodiment of the twenty-fourth embodiment, at least one spinel-type metal oxide component according to the formula $M'M''_2O_4$ of formula (2) is combined with at least one perovskite-type metal oxide component according to formula (1) wherein, in the formula $M'M''O_3$ of formula (1), M' is a divalent metal ion and M" is a tetravalent metal ion. In a more specific embodiment, at least one spinel-type metal oxide component of formula (2) is combined with at least one perovskite-type metal oxide component according to the subformula $MTiO_3$ wherein M' is a divalent metal ion. In a more specific embodiment, at least one spinel-type metal oxide component of formula (2) is combined with at least one perovskite-type metal oxide component according to the subformula $M'TiO_3$ wherein M' is an alkaline earth metal ion. In a more specific embodiment, at least one spinel-type metal oxide component of formula (2) is combined with a perovskite-type metal oxide component of formula $BaTiO_3$. In more specific embodiments, the spinel-type metal oxide component is according to the formula $M'M''_2O_4$ of formula (2), wherein M' is a divalent metal ion and M" is a trivalent metal ion, for any of the specific embodiments enumerated above. In other specific embodiments, the spinel-type metal oxide component is according to the subformula $M'Fe_2O_4$ wherein M' is a divalent metal ion, for any of the specific embodiments enumerated above. In other specific embodiments, the spinel-type metal oxide component is according to the subformula $CoFe_2O_4$, for any of the specific embodiments enumerated above.

In another specific embodiment of the twenty-fourth embodiment, at least one spinel-type metal oxide component of formula (2) is combined with at least one perovskite-type metal oxide component according to formula (1) wherein, in the formula $M'M''O_3$ of formula (1), M' and M" are both trivalent metal ions. In a more specific embodiment, at least one spinel-type metal oxide component of formula (2) is combined with at least one perovskite-type metal oxide component according to the subformula $(RE)M''O_3$ wherein RE is a rare earth trivalent metal ion selected from any of the rare earth metals described above. In a more specific embodiment, at least one spinel-type metal oxide component of formula (2) is combined with at least one perovskite-type metal oxide component according to the subformula $LaM''O_3$ wherein M" is a trivalent metal ion. In a more specific embodiment, at least one spinel-type metal oxide component of formula (2) is combined with at least one perovskite-type metal oxide component according to the subformula $LaM''O_3$ wherein M" is a trivalent transition metal ion. In a more specific embodiment, at least one spinel-type metal oxide component of formula (2) is combined with a perovskite-type metal oxide of formula $LaMnO_3$. In more specific embodiments, the spinel-type metal oxide component is according to the formula $M'M''_2O_4$ of formula (2), wherein M' is a divalent metal ion and M" is a trivalent metal ion, for any of the specific embodiments enumerated above. In other specific embodiments, the spinel-type metal oxide component is according to the subformula $M'Fe_2O_4$ wherein M' is a divalent metal ion, for any of the specific embodiments enumerated above. In other specific embodiments, the spinel-type metal oxide component is according to the subformula $CoFe_2O_4$, for any of the specific embodiments enumerated above.

In yet another specific embodiment of the twenty-fourth embodiment, at least one perovskite-type metal oxide component according to the formula $M'M''O_3$ of formula (1) is combined with at least one spinel-type metal oxide component of formula (2) wherein, in the formula $M'M''_2O_4$ of formula (2), M' is a divalent metal ion and M" is a trivalent metal ion. In a more specific embodiment, at least one perovskite-type metal oxide component according to formula (1) is combined with at least one spinel-type metal oxide component according to the subformula $M'Fe_2O_4$ wherein M' is a divalent metal ion. In a more specific embodiment, at least one perovskite-type metal oxide component according to formula (1) is combined with at least one spinel-type metal oxide component of formula $CoFe_2O_4$.

As discussed earlier, the surface on which the phase-separable components are epitaxially deposited can influence an effect on the growth mechanisms of the separated components on the substrate. Accordingly, the choice of deposition surface in the biaxially-textured substrate can be appropriately selected or modified in order to adjust, modulate, or optimize crystallographic and other morphological characteristics of the epitaxially-grown components. Any of the materials described above for the phase-separable components are also applicable herein as a substrate surface for the epitaxial growth of the phase-separated components.

For example, in one embodiment, the substrate surface is a spinel-type oxide according to the formula $M'M''_2O_4$, wherein M' and M" are independently monovalent, divalent, trivalent, tetravalent, pentavalent, or hexavalent, provided that the sum of oxidation states of M' and M" add to +8 to charge balance with oxide atoms. In a specific embodiment, the substrate surface is characterized in that M' and M" in the formula $M'M''_2O_4$ are, respectively, a divalent and trivalent metal ion. In a more specific embodiment, the substrate surface is characterized by the subformula $M'Fe_2O_4$ wherein M' is a divalent metal ion. In a specific embodiment, the substrate surface is characterized by the formula $CoFe_2O_4$.

In another embodiment, the substrate surface is a perovskite-type metal oxide according to the formula $M'M''O_3$, wherein M' and M" are independently monovalent, divalent, trivalent, tetravalent, or pentavalent provided that the sum of oxidation states of M' and M" add to +6 to charge balance with oxide atoms. In a specific embodiment, the substrate surface is characterized in that M' and M" in the formula $M'M''O_3$ are, respectively, a divalent and tetravalent metal ion. In a more specific embodiment, the substrate surface is characterized by the subformula $M'TiO_3$ wherein Mt is a divalent metal ion. In a more specific embodiment, the substrate surface is characterized in that M' in the subformula $M'TiO_3$ is an alkaline earth metal ion. For example, in specific embodiments, the substrate surface can be a material of composition $MgTiO_3$, $CaTiO_3$, $SrTiO_3$, or $BaTiO_3$. In another embodiment, the substrate surface is characterized in that M' and M" in the formula $M'M''O_3$ are, respectively, both trivalent metal ions. In a more specific embodiment, the substrate surface is characterized by the subformula $(RE)M''O_3$ wherein RE is a trivalent rare earth metal and M" is a trivalent metal. In a more specific embodiment, the substrate surface is characterized by the subformula LaM"$O_3$, wherein M" is a trivalent metal ion. In a more specific embodiment, the substrate surface is characterized by the formula LaMnO$_3$.

The superconducting film deposited on the phase-separated layer is preferably any of the high temperature superconductor (HTS) materials known in the art. A high temperature superconducting material is generally characterized by having a superconducting critical temperature ($T_c$) of at least 35 K, and more preferably, greater than 77 K. Currently, a majority of the HTS materials belong to the general class of copper oxide superconducting materials.

In one embodiment, the superconducting film includes a rare-earth (RE) or transition metal (TM) barium copper oxide material (hereinafter, a "barium copper oxide" material). The rare earth element can be any of the lanthanide or actinide metals listed in the Periodic Table of the Elements (hereinafter, the "Periodic Table"). The lanthanide metals generally refer to any of the elements of the Periodic Table having an atomic number of 57 to 71. The actinide metals generally refer to any of the elements of the Periodic Table having an atomic number of 90 to 103. The transition metals generally refer to any of the elements located in Groups 3-12 of the Periodic Table (i.e., the corresponding scandium through zinc groups). In a particular embodiment, the barium copper oxide material is according to the formula (RE)Ba$_2$Cu$_3$O$_7$, wherein RE is a rare earth or transition metal element. Some examples of suitable RE metals include yttrium (Y), neodymium (Nd), gadolinium (Gd), thulium (Tm), ytterbium (Yb), lutetium (Lu), and combinations thereof.

For example, in one embodiment, the superconducting material is a yttrium barium copper oxide (YBCO) material. Any of the yttrium barium copper oxide materials known in the art can be used herein. In one instance, the yttrium barium copper oxide material can be generally described by the formula YBa$_2$Cu$_3$O$_{7-x}$, wherein x is generally a number within the approximate range $0 \leq x \leq 1$. As used herein, the formula YBa$_2$Cu$_3$O$_7$ is ascribed the same meaning, and includes all of the possible different variations, as governed within the former broader formula. Some examples of other types of yttrium barium copper oxide materials include Y$_3$Ba$_4$Cu$_7$O$_{16}$, Y$_2$Ba$_4$Cu$_7$O$_{15}$, Y$_2$CaBa$_4$Cu$_7$O$_{16}$, (Y$_{0.5}$Lu$_{0.5}$)Ba$_2$Cu$_3$O$_7$, (Y$_{0.5}$Tm$_{0.5}$)Ba$_2$Cu$_3$O$_7$, and (Y$_{0.5}$Gd$_{0.5}$)Ba$_2$Cu$_3$O$_7$.

In another embodiment, the high temperature superconducting film includes a thallium-containing barium copper oxide composition. More particularly, the composition may be a thallium barium calcium copper oxide material. Any of the thallium barium calcium copper oxide materials can be used herein. In one instance, the thallium barium calcium copper oxide material includes a composition according to the formula TlBa$_2$Ca$_{n-1}$Cu$_n$O$_{2n+3}$, wherein n is generally a number greater than 1 and up to 4. In another instance, the thallium barium calcium copper oxide material includes a composition according to any of the formulas Tl$_2$Ba$_2$Ca$_{n-1}$Cu$_n$O$_{2n+2}$, Tl$_2$Ba$_2$Ca$_{n-1}$Cu$_n$O$_{2n+3}$, or Tl$_2$Ba$_2$Ca$_{n-1}$Cu$_n$O$_{2n+4}$, wherein n is generally a number greater than 1 and up to 4. Some specific examples of such superconducting compositions include Tl$_2$Ba$_2$Ca$_2$Cu$_3$O$_{10}$ (TBCCO-2223), Tl$_2$Ba$_2$CaCu$_2$O$_6$, TlBa$_2$Ca$_2$Cu$_3$O$_9$, and TlBa$_2$Ca$_3$Cu$_4$O$_{11}$.

In another embodiment, the high temperature superconducting film includes a mercury-containing barium copper oxide material. More particularly, the composition may be a mercury barium calcium copper oxide material. Any of the mercury barium calcium copper oxide materials can be used herein. In a particular embodiment, the mercury barium calcium copper oxide material includes a composition according to the formula HgBa$_2$Ca$_{n-1}$Cu$_n$O$_{2n+2}$, wherein n is a number greater than 1 and up to 4. Some specific examples of such superconducting compositions include HgBa$_2$Ca$_2$Cu$_3$O$_8$, HgBa$_2$Ca$_2$Cu$_4$O$_{10}$, HgBa$_2$(Ca$_{1-a}$Sr$_a$)Cu$_3$O$_8$ (wherein $0 \leq a \leq 1$), and (Hg$_{0.8}$Tl$_{0.2}$)Ba$_2$Ca$_2$Cu$_3$O$_{8+x}$.

In yet another embodiment, the high temperature superconducting film includes a bismuth- and/or strontium-containing calcium copper oxide material. More particularly, the composition may be a bismuth strontium calcium copper oxide (BSCCO) material. Any of the BSCCO materials can be used herein. In a particular embodiment, the BSCCO material includes a composition according to the formula Bi$_2$Sr$_2$Ca$_n$Cu$_{n+1}$O$_{2n+6}$. Some specific examples of such superconducting compositions include Bi$_2$Sr$_2$CaCu$_2$O$_8$ (BSCCO-2212), Bi$_2$Sr$_2$Ca$_2$Cu$_3$O$_{10}$ (BSCCO-2223), Bi$_2$Sr$_2$CaCu$_2$O$_9$, and Bi$_2$Sr$_2$(Ca$_{0.8}$Y$_{0.2}$)Cu$_2$O$_8$.

In still another embodiment, the HTS film includes a lanthanum-containing copper oxide material. The lanthanum-containing copper oxide material can include a composition according to the general formula La$_{2-x}$M$_x$CuO$_4$, wherein x is greater than zero and less than 2, and M is an alkaline earth metal ion, such as Mg, Ca, Sr, or Ba. Some specific examples of such superconducting materials include La$_{1.85}$Ba$_{0.15}$CuO$_4$ (LBCO) and La$_{1.85}$Sr$_{0.15}$CuO$_4$ (LSCO).

Any of the superconducting materials described above can include dopant amounts of other metals which may be included to facilitate certain desired properties of the HTS film. Some examples of rare earth dopants include yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), or a combination thereof. In a particular embodiment, YBCO film compositions are doped with one or more of the above rare earth metals.

The superconducting film can also be composed of one more than one superconducting layer. For example, it may be preferred in certain embodiments to apply a YBCO layer onto a BSCCO layer, or vice-versa.

The superconducting film can be of any suitable thickness. For electrical power applications, the thickness is typically no more than about 5 microns (5 μm) thick, and more typically no more than about 10 μm thick. For example, in different embodiments, the thickness of the superconducting film can be about 5, 4, 3, 2, or 1 μm. However, the thickness is highly dependent on the particular application, and thus, can be of much greater thickness (e.g., 10 or more microns), or alternatively, of much lesser thickness (e.g., no more than 1 μm, or 0.5 μm, or 0.1 μm) for more specialized applications.

The defected superconducting films described herein are particularly applied as improved superconducting tapes or wires. As generally understood in the art, a tape or wire generally refers to an article having a width dimension much smaller than its length dimension. Typically, the tape or wire can have a length of at least 0.1 m, with lengths of 10 m, 50 m, 100 m, 1 km, or more, being common.

The superconducting layer can also be coated with any of a variety of materials that can serve any useful purpose. For example, a non-superconducting metal layer may be applied on the superconducting film to protect the film. Alternatively, a coating (e.g., metallic, polymeric, plastic, rubber, paint, or hybrid) can be applied onto the superconducting layer to provide, for example, corrosion resistance, electrical or magnetic insulation, rigidity, or flexibility.

The phase-separable layer and the superconducting film can be deposited by any suitable method known in the art. For example, the films can be deposited by physical vapor deposition (PVD), chemical vapor deposition (CVD), sputtering, sol-gel, dip coating, electrodeposition, spray pyrolysis, and the like. In a preferred embodiment, the deposition of these layers is by a PVD technique, such as a laser ablation technique. More preferably, the PVD technique is a pulsed laser deposition technique. In another embodiment, the films are deposited by a molecular beam chemical vapor deposition (MOCVD) technique.

Examples have been set forth below for the purpose of illustration and to describe the best mode of the invention at the present time. However, the scope of this invention is not to be in any way limited by the examples set forth herein.

Example 1

Figure 4A:
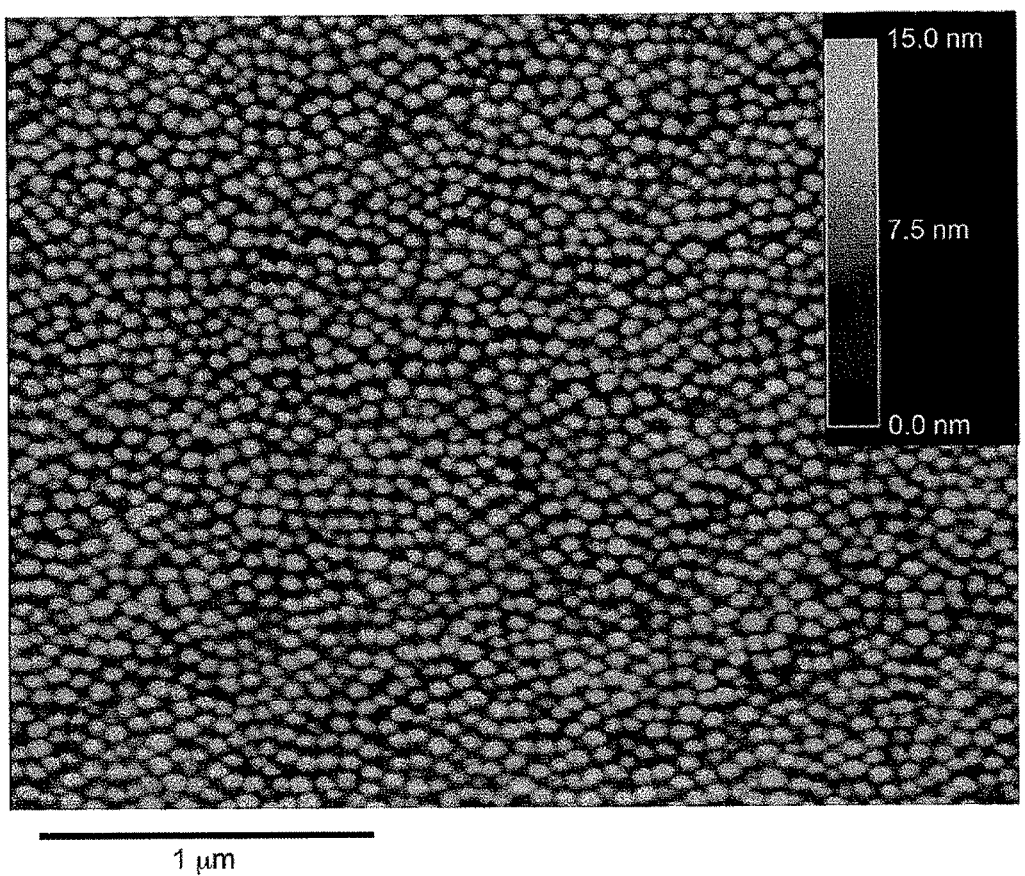
FIG. 4a. Micrograph of a phase-separated, 35 vol % $CoFe_2O_4$ (CFO)/65 vol % $BaTiO_3$ (BTO) layer of film grown epitaxially on a $SrTiO_3$ substrate. The white nanorods correspond to the CFO phase.
Figure 4B:
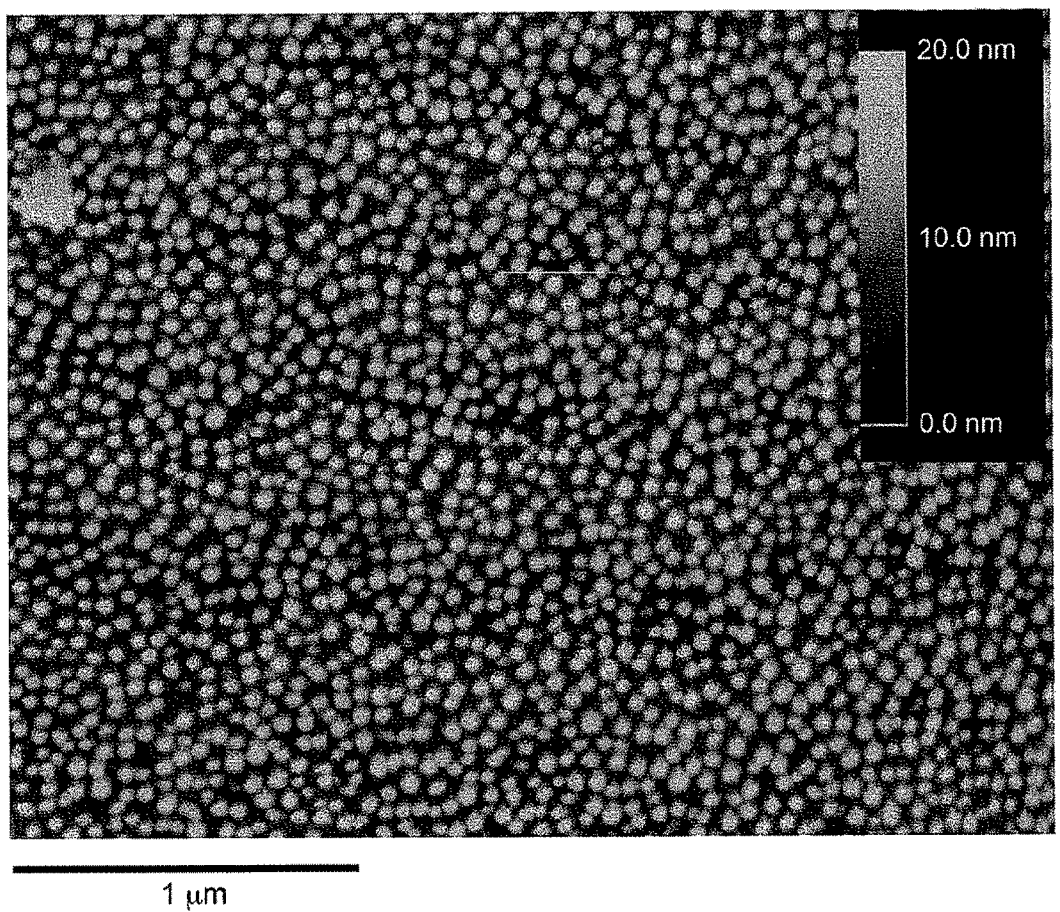
FIG. 4b. Micrograph of a phase-separated, 20 vol % $CoFe_2O_4$ (CFO)/80 vol % $BaTiO_3$ (BTO) layer of film grown epitaxially on a $SrTiO_3$ substrate. The white nanorods correspond to the CFO phase.
Figure 4C:
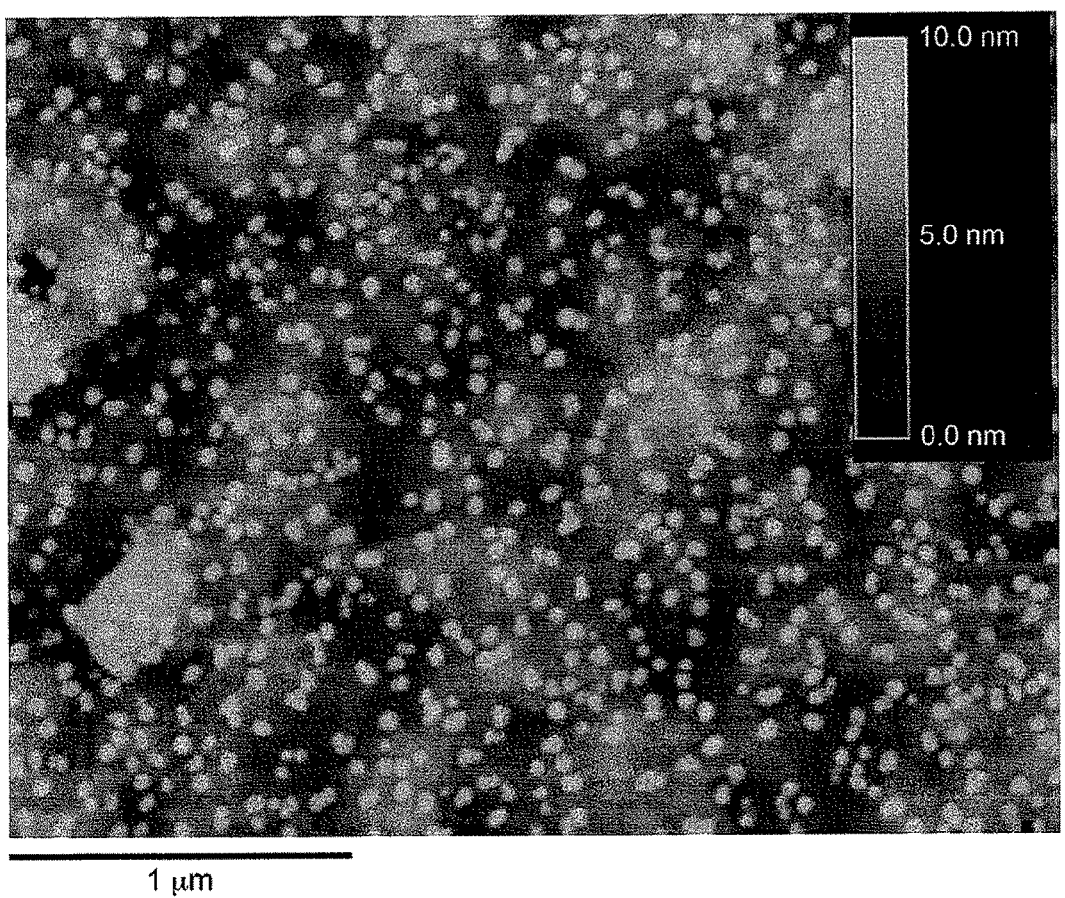
FIG. 4c. Micrograph of a phase-separated, 4 vol % $CoFe_2O_4$ (CFO)/96 vol % $BaTiO_3$ (BTO) layer of film grown epitaxially on a $SrTiO_3$ substrate. The white nanorods correspond to the CFO phase.

Phase-Separated Layers Containing $CoFe_2O_4$ and $BaTiO_3$ as Components Epitaxially Grown on a $SrTiO_3$ Substrate Phase-separated layers containing $CoFe_2O_4$ and $BaTiO_3$ as components were grown epitaxially on a $SrTiO_3$ substrate according to the following procedure. (100) oriented $SrTiO_3$ substrates were mounted onto a heater of a pulsed laser ablation deposition system using silver paste. Depositions were performed using a mixed target of $CoFe_2O_4$ and $BaTiO_3$, prepared via solid state sintering. Depositions were performed in a temperature range of 700-950° C. All depositions were performed using a KrF excimer laser ($\lambda$=248 nm). FIGS. 4a-4c are micrographs obtained using atomic force microscopy.

FIGS. 4a-4c show $CoFe_2O_4$—$BaTiO_3$ phase-separated systems that vary in the volume concentration of the $CoFe_2O_4$ component (herein functioning as a nanophase component shown as the light-colored phase) relative to a $BaTiO_3$ component (herein functioning as a matrix component shown as the dark-colored phase). FIGS. 4a, 4b, and 4e show the nanophase structural morphology for the phase-separated system when $CoFe_2O_4$ is in a volume concentration of, respectively, 35 vol %, 20 vol %, and 4 vol %. The results demonstrate, first, the concept of a phase-separable layer producing the desired nanoscale characteristics, as well as the concept that nanophase surface density of a phase-separated layer can be modulated by changing the concentration of one phase-separable component relative to another phase-separable component. As shown by the figures, the nanophase surface density follows a trend of decreasing with decreasing amount of the nanophase component.

Example 2

Phase-Separated Layer Containing MgO and $LaMnO_3$ as Components Epitaxially Grown on a $SrTiO_3$ Substrate Phase-separated layers containing MgO and $LaMnO_3$ as components were grown epitaxially on a $SrTiO_3$ substrate according to the following procedure. (100) oriented $SrTiO_3$ substrates were mounted onto a heater of a pulsed laser ablation deposition system using silver paste. Depositions were performed using a mixed target of MgO and $LaMnO_3$, prepared via solid state sintering. Depositions were performed in a temperature range of 700-950° C. All depositions were performed using a KrF excimer laser ($\lambda$=248 nm).

Figure 5A:
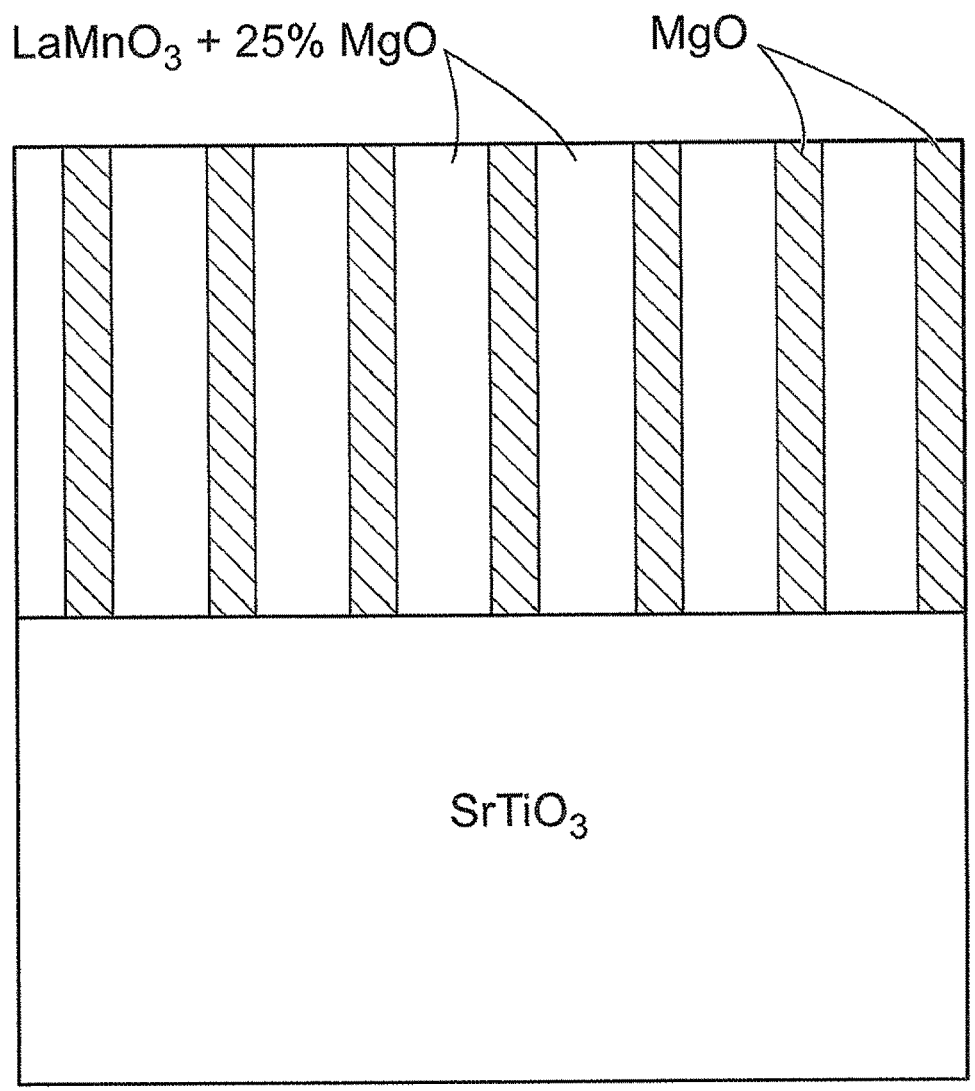
FIG. 5a. A depiction of a phase-separated, 25 vol % MgO/ 75 vol % $LaMnO_3$ (LMO) layer of film grown epitaxially on a $SrTiO_3$ substrate.
Figure 5B:
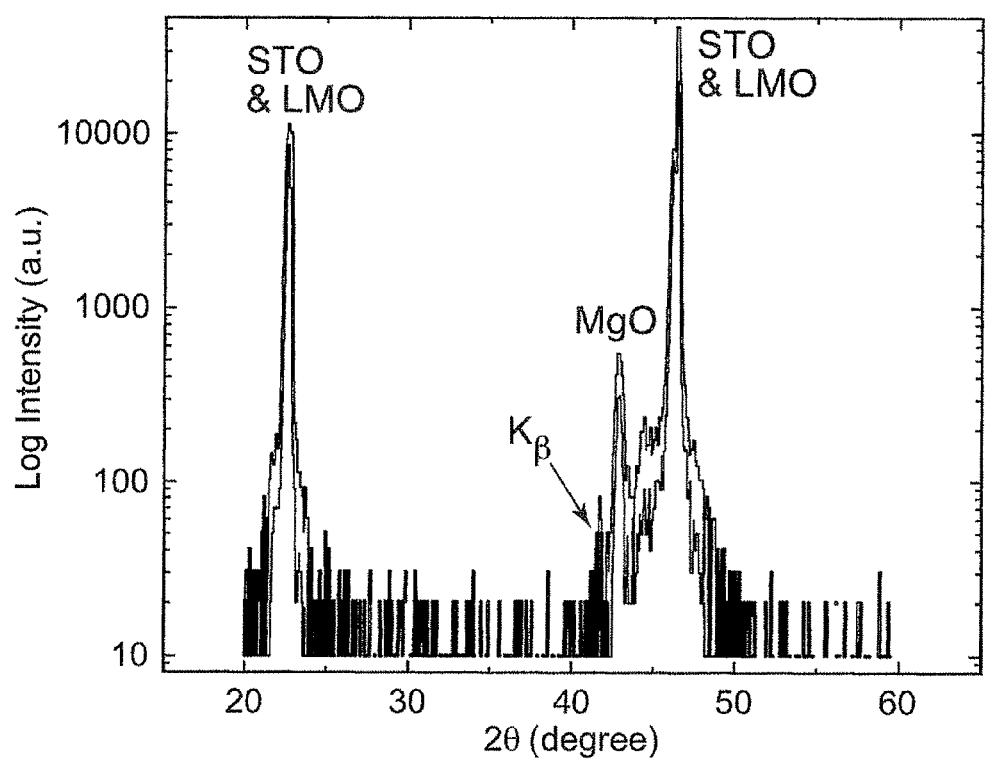
Figure 5C:
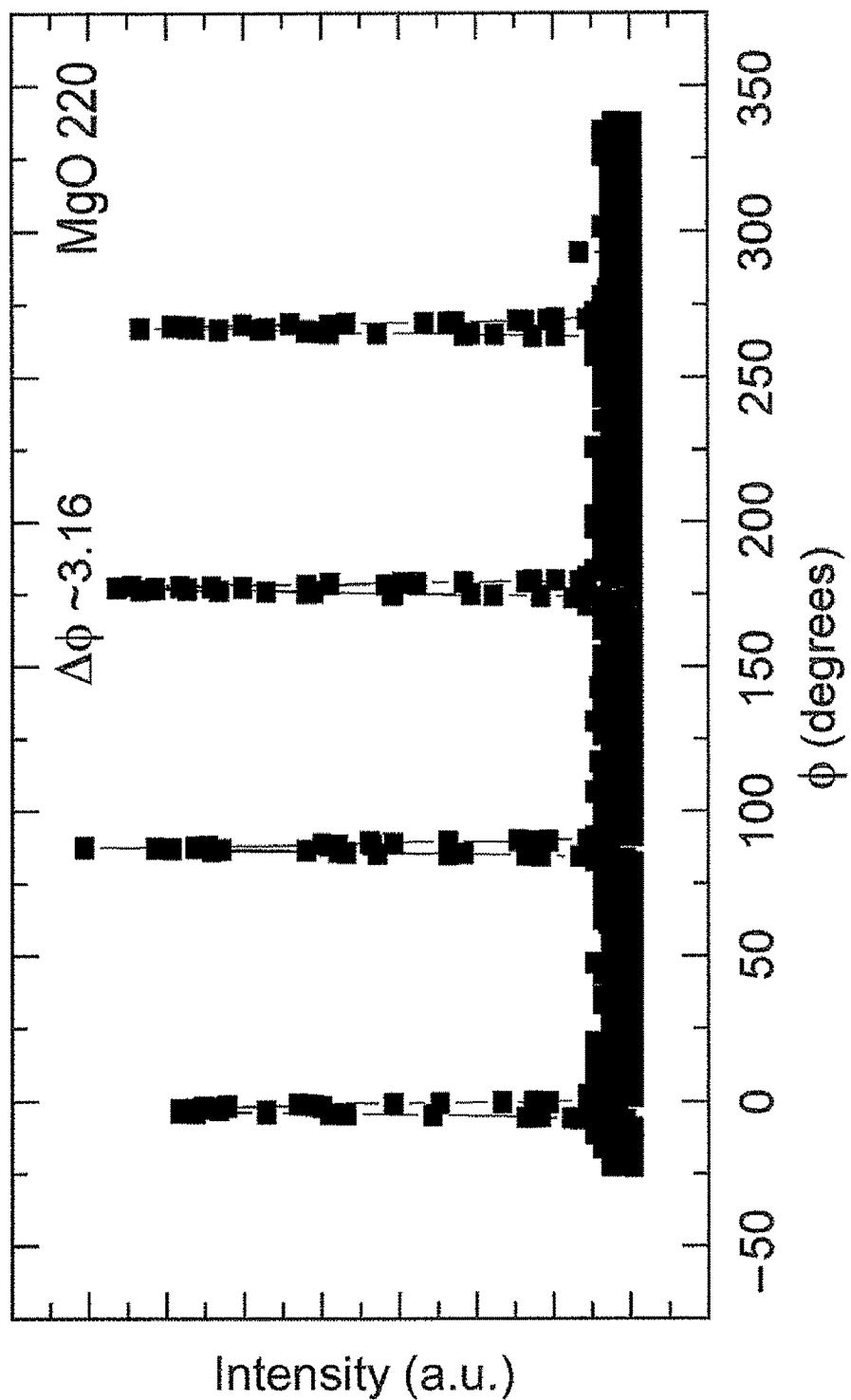
Figure 5D:
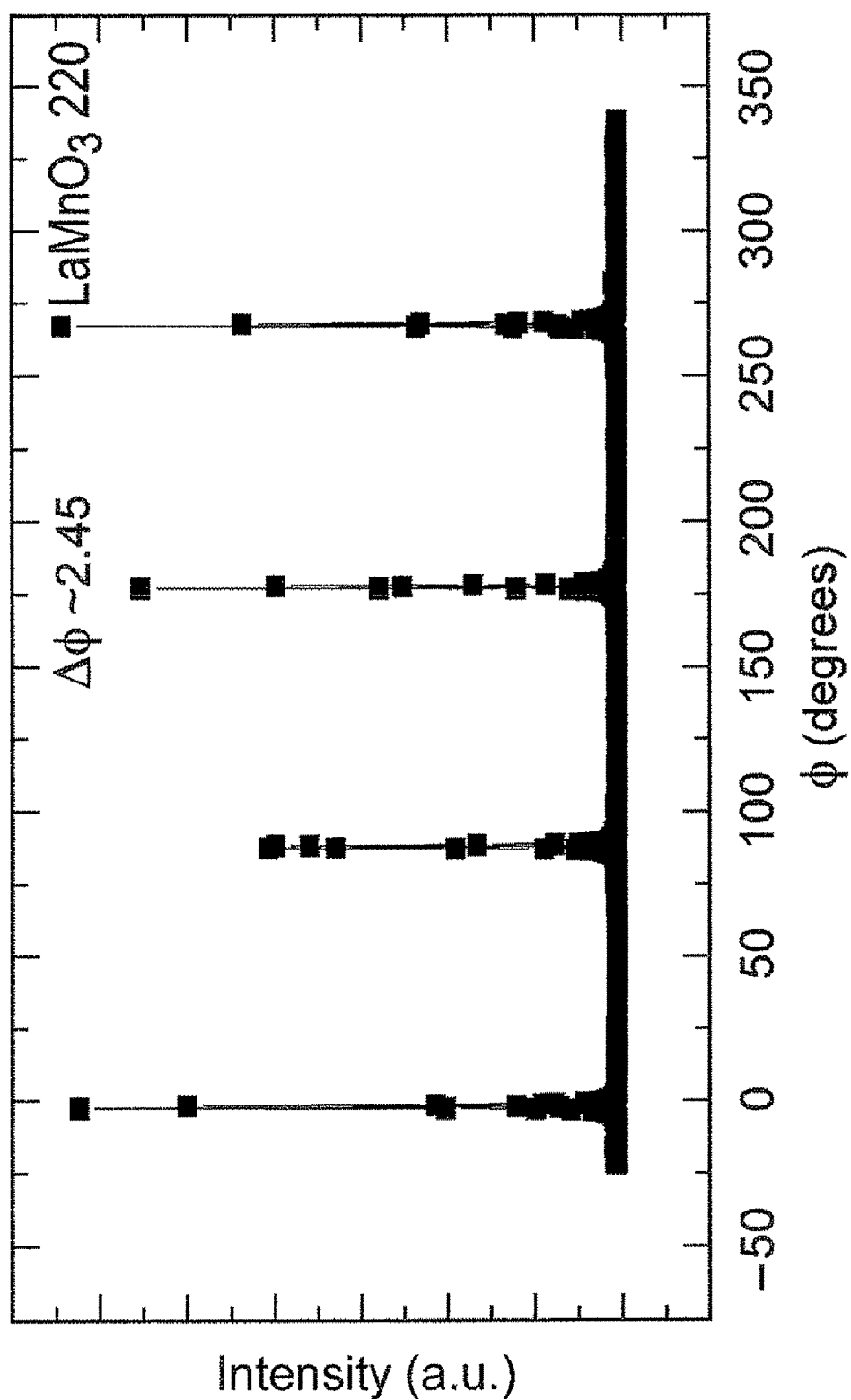
Figure 5E:
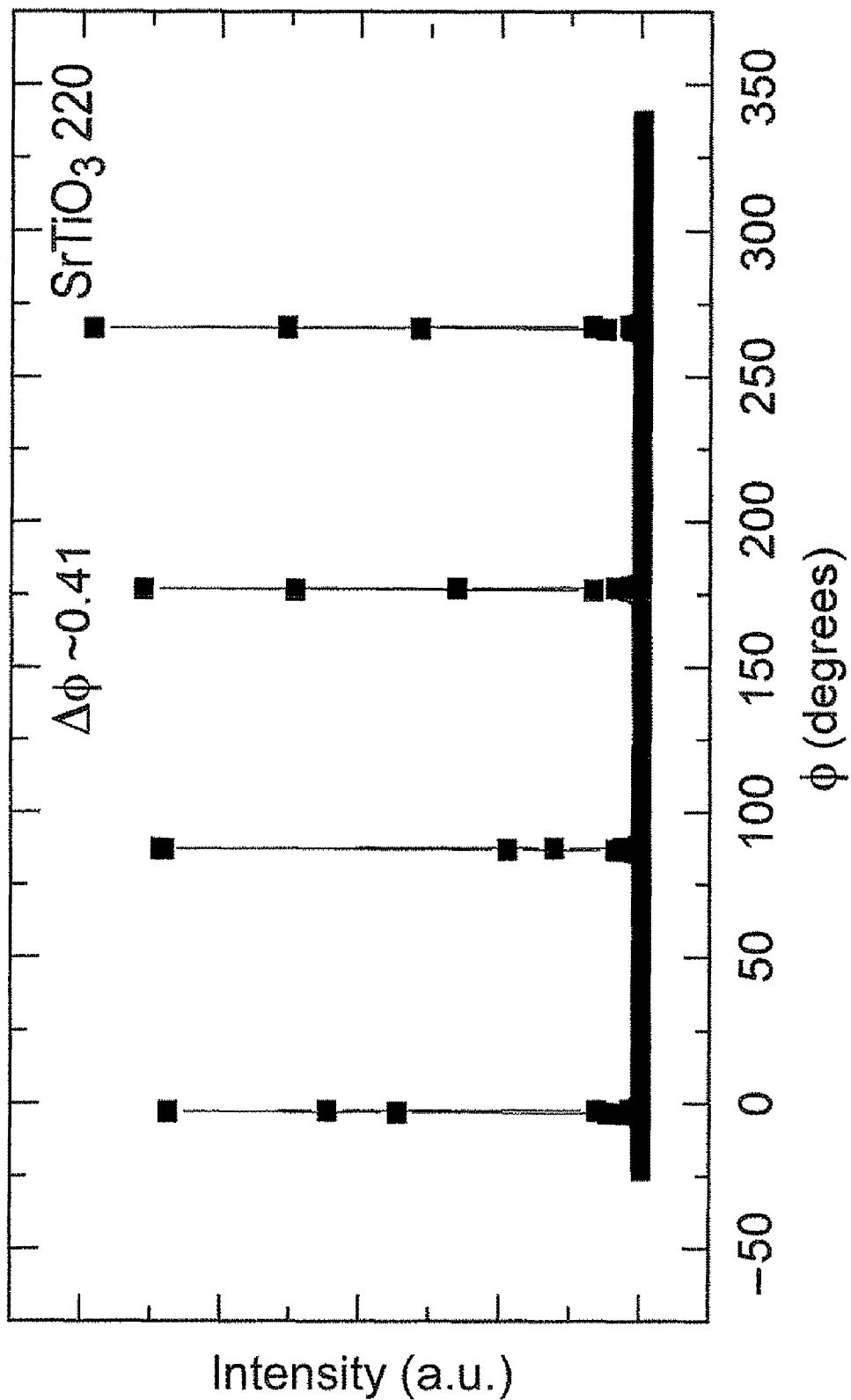
FIG. 5e. X-ray diffraction phi-scans of the phase-separated layer depicted in FIG. 5a. ($SrTiO_3$ Component)
Figure 5F:
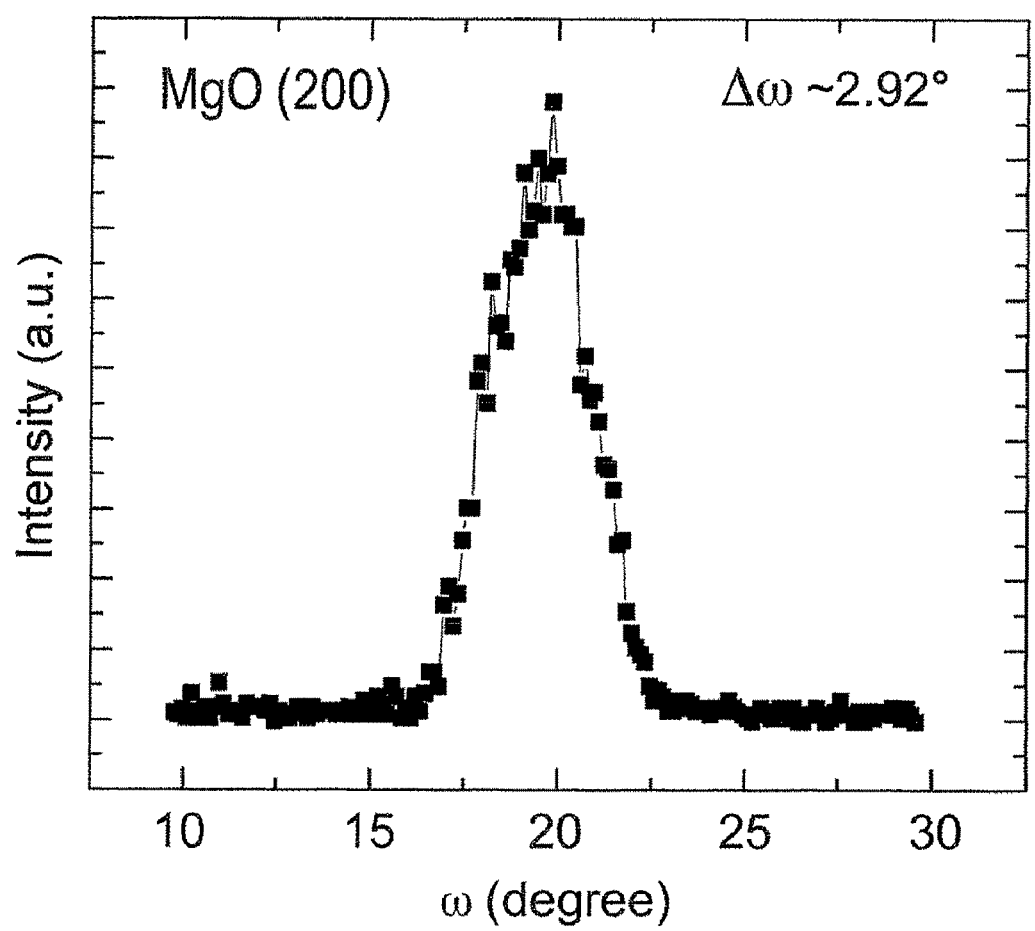

FIG. 5a is a depiction of a phase-separated, 25 vol % MgO/75 vol % $LaMnO_3$ (LMO) layer of film grown epitaxially on a $SrTiO_3$ substrate. FIG. 5b shows a theta-2theta X-ray diffraction scan of the phase-separated, 25 vol % MgO-75 vol % $LaMnO_3$ layer of film grown epitaxially on a $SrTiO_3$ substrate. Separate peaks corresponding to MgO and $LaMnO_3$ can be observed indicating phase separation into MgO and $LaMnO_3$. FIG. 5c shows X-ray diffraction phi-scans of the phase-separated, 25 vol % MgO-75 vol % $LaMnO_3$ film grown epitaxially on the $SrTiO_3$ substrate. Separate phi-scans for MgO (FIG. 5c) and $LaMnO_3$ (FIG. 5d) in comparison to the phi-scan from the $SrTiO_3$ (FIG. 5d) substrate are shown. The data indicates that both the MgO and $LaMnO_3$ phase of the film are epitaxial with the substrate, $SrTiO_3$, and have a sharp in-plane texture. Both phases have a cube-on-cube epitaxy with the $SrTiO_3$ substrate. FIG. 5f shows X-ray diffraction omega-scans or rocking curves for the MgO phase. Clearly the phase is very well aligned with a full-width-half-maximum of 2.92°.

Example 3

Phase-Separated Layer Containing MgO and $LaMnO_3$ as Components Epitaxially Grown on a $LaMnO_3$/MgO/IBAD MgO/Hastelloy® Substrate Details of fabrication of the substrate comprised of $LaMnO_3$/MgO/IBAD MgO/Hastelloy® can be found in U.S. Pat. No. 6,764,770. Phase-separated layers containing MgO and $LaMnO_3$ as components were grown epitaxially on this substrate according to the following procedure. The substrates were mounted onto a heater of a pulsed laser ablation deposition system using silver paste. Depositions were performed using a mixed target of MgO and $LaMnO_3$, prepared via solid state sintering. Depositions were performed in a temperature range of 700-950° C. All depositions were performed using a KrF excimer laser ($\lambda$=248 nm).

Figure 6A:
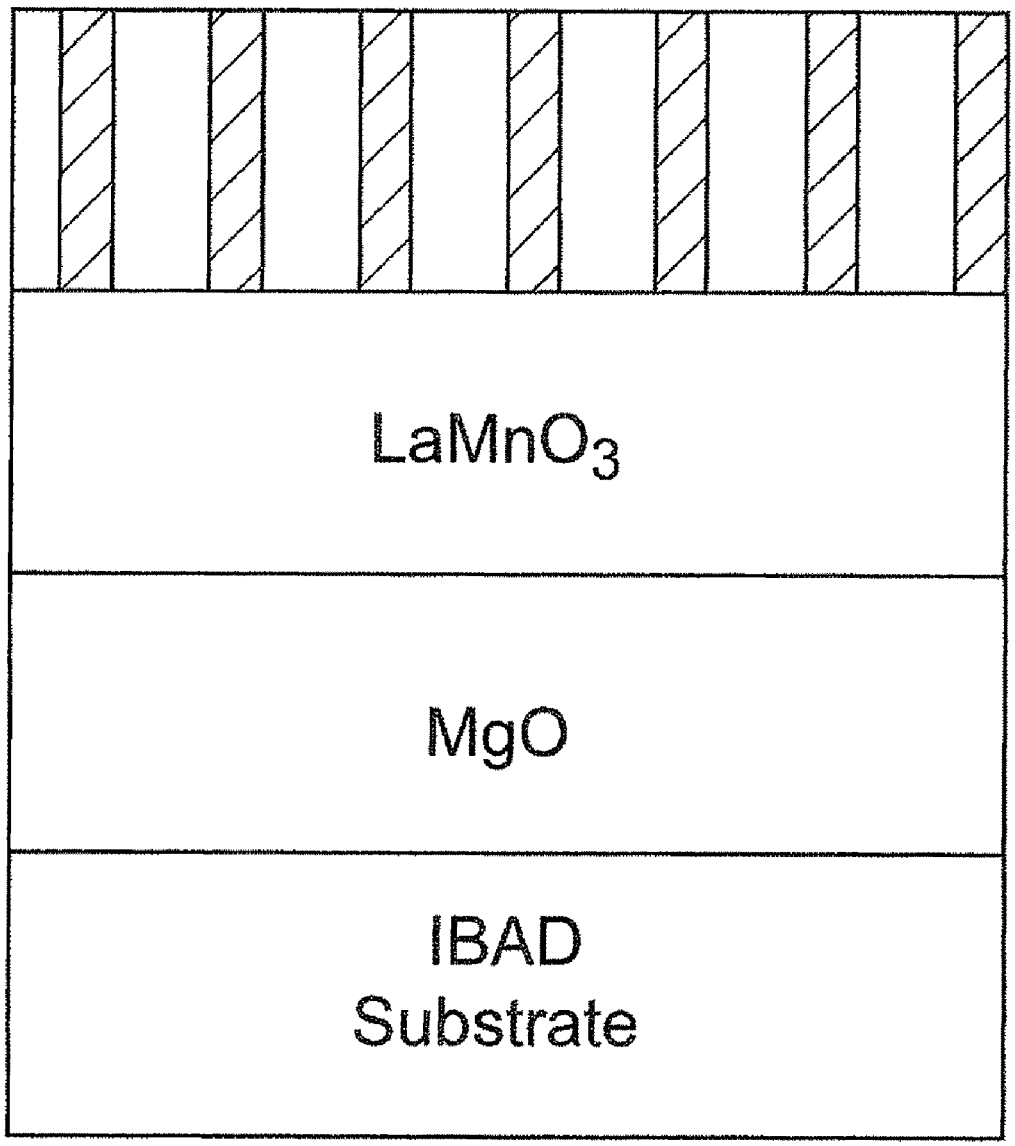
FIG. 6a. A depiction of a phase-separated, 25 vol % MgO-75 vol % $LaMnO_3$ layer of film grown epitaxially on a $LaMnO_3$/MgO/IBAD MgO/Hastelloy® substrate.

FIG. 6a is a schematic depiction of a phase-separated, 25 vol % MgO/75 vol % $LaMnO_3$ layer of film grown epitaxially on the $LaMnO_3$/MgO/IBAD MgO/Hastelloy® substrate.

Figure 6B:
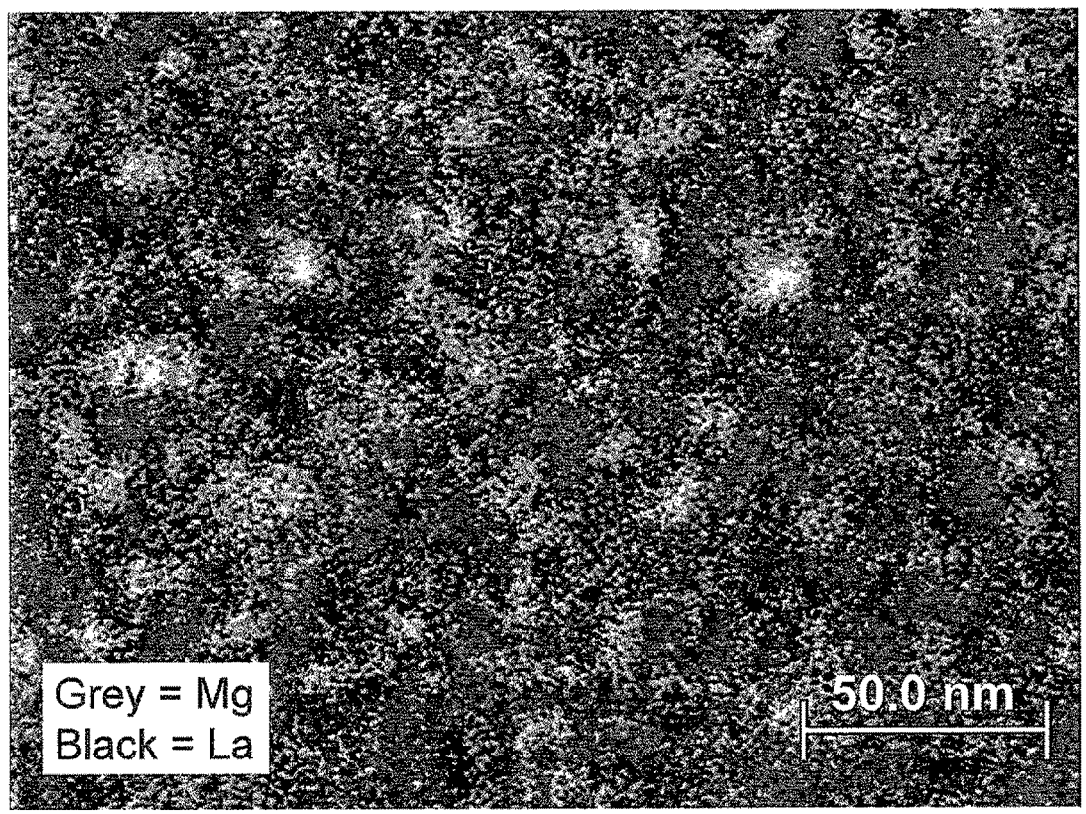

FIG. 6b is a high-resolution scanning Auger map of the surface of phase-separated, 25 vol % MgO/75 vol % $LaMnO_3$ layer of film grown epitaxially on the $LaMnO_3$/MgO/IBAD MgO/Hastelloy® substrate. The light regions correspond to Mg-rich regions. The compositional map was produced using a commercial, high-resolution, scanning Auger Microscope System.

Figure 6C:
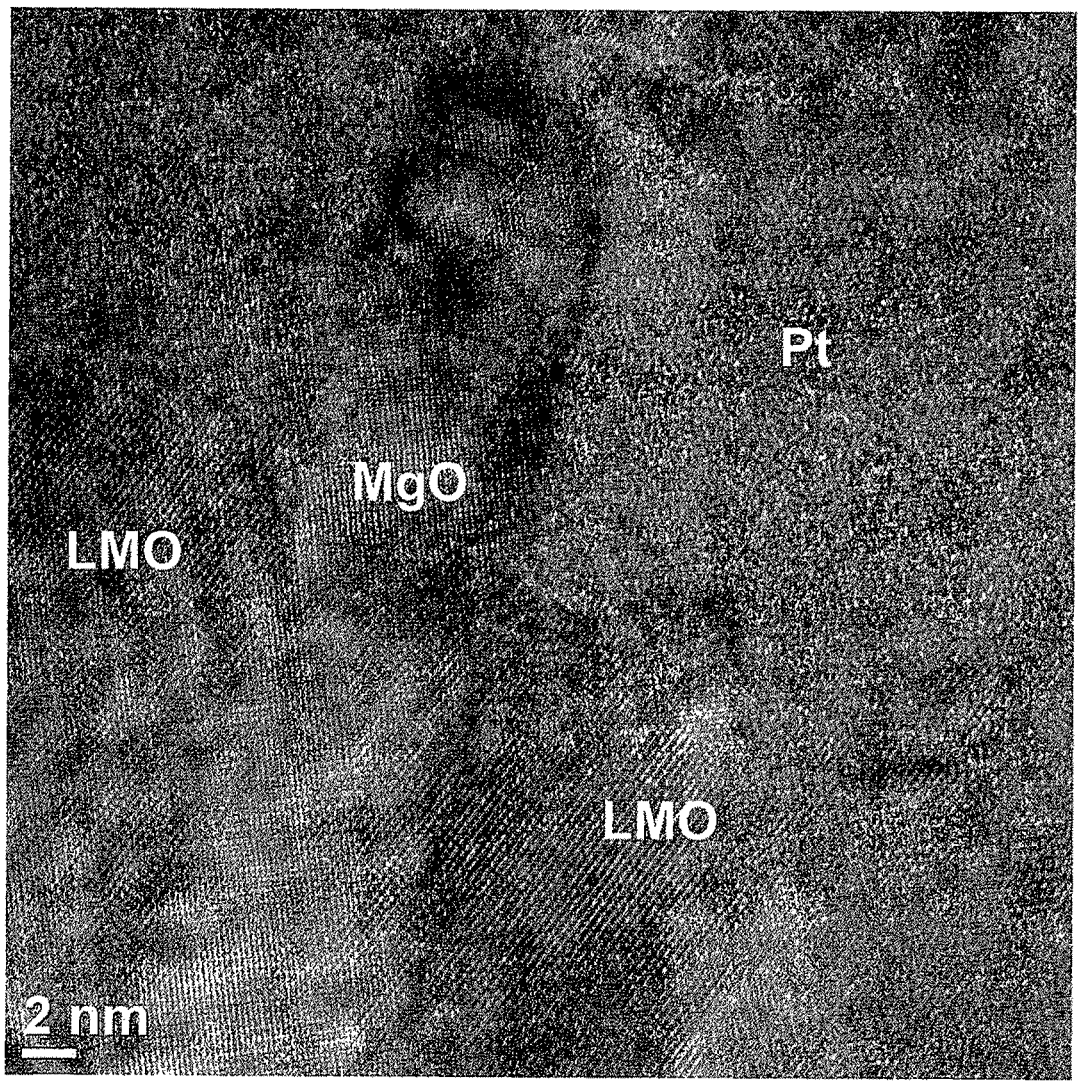

FIG. 6c is a cross-sectional transmission electron microscope (TEM) image of the phase-separated, 25 vol % MgO/75 vol % $LaMnO_3$ layer of film grown epitaxially on a $LaMnO_3$/MgO/IBAD MgO/Hastelloy® substrate. The TEM specimen was first prepared from the film/substrate assembly using a focused-ion-beam (FIB) preparation method. Once the TEM thin-foil or specimen was prepared, it was examined using a transmission electron microscope. It can be seen that the MgO is nanoscale and extends out of the surface of the film.

Example 4

Superconducting YBCO Film Grown on Phase-Separated Layer Containing MgO and $LaMnO_3$ as Components Epitaxially Grown on a $LaMnO_3$/MgO/IBAD MgO/Hastelloy® Substrate Details of fabrication of the substrate comprised of $LaMnO_3$/MgO/IBAD MgO/Hastelloy® can be found in U.S. Pat. No. 6,764,770. Phase-separated layers containing MgO and $LaMnO_3$ as components were grown epitaxially on this substrate according to the procedure outlined in Example 3.

The substrate with the phase-separated layer was mounted onto a heater of a pulsed laser ablation deposition system using silver paste. Depositions were performed using a mixed target of YBCO, prepared via solid state sintering. Depositions were performed in a temperature range of 750-800° C. All depositions were performed using a KrF excimer laser ($\lambda$=248 nm).

Figure 7A:
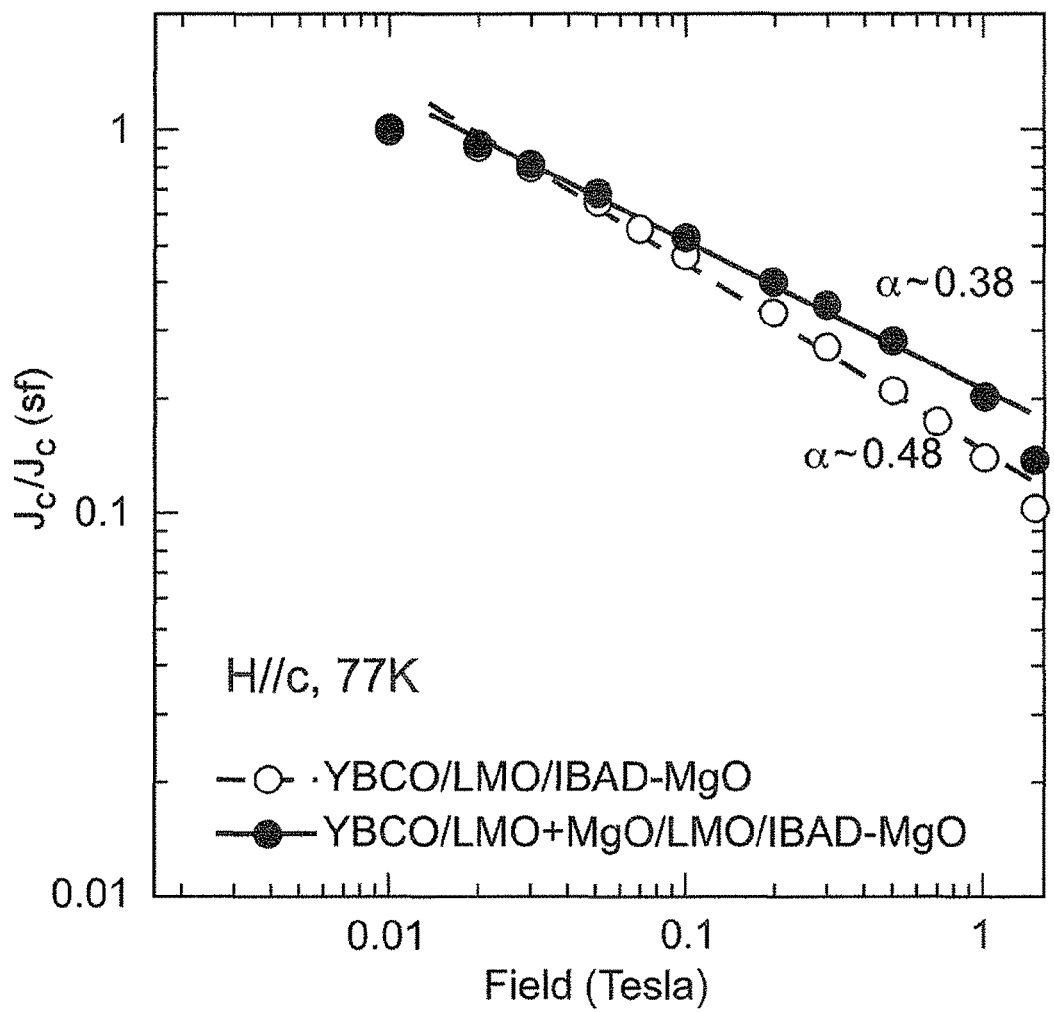
FIG. 7a. Graph showing normalized $J_c$ versus applied field for a YBCO film grown on $LaMnO_3$/MgO/IBAD MgO/Hastelloy® substrate and a YBCO film grown on the phase-separated sample (25 vol % MgO-75 vol % $LaMnO_3$)/ $LaMnO_3$/MgO/IBAD MgO/Hastelloy® substrate.

FIG. 7a shows the normalized critical current density ($J_c$) versus applied magnetic field for a YBCO film grown on LaMnO$_3$/MgO/IBAD MgO/Hastelloy® substrate and a YBCO film grown on the phase separated sample (25 vol % MgO-75 vol % LaMnO$_3$)/LaMnO$_3$/MgO/IBAD MgO/Hastelloy® substrate. The alpha value for the film on (25 vol % MgO-75 vol % LaMnO$_3$)/LaMnO$_3$/MgO/IBAD MgO/Hastelloy® substrate is reduced to 0.38, indicating the presence of linear defects. When the alpha value is reduced from 0.48, it implies superior flux-pinning because of extrinsic defects in the superconducting film. With a fully optimized defect structure in the superconducting film, the alpha value can be even below 0.2.

Figure 7B:
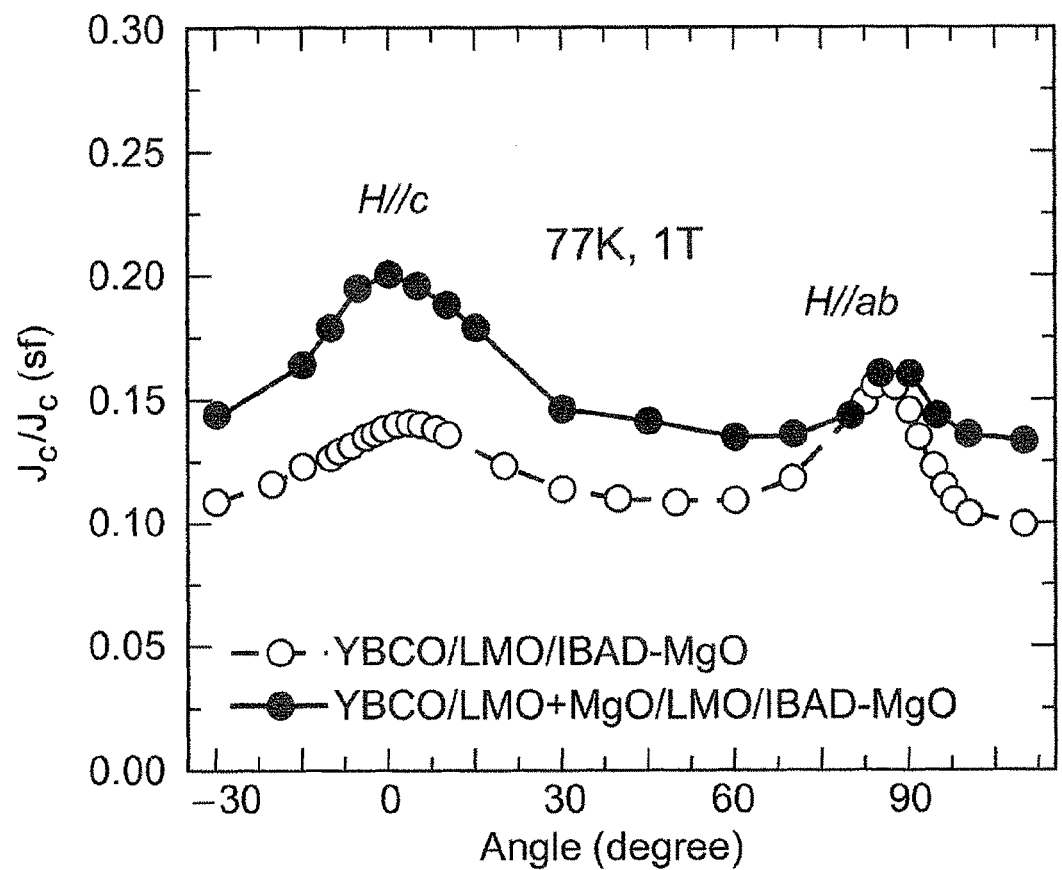
FIG. 7b. Graph showing normalized $J_c$ versus applied field angle for a YBCO film grown on $LaMnO_3$/MgO/IBAD MgO/ Hastelloy® substrate and a YBCO film grown on the phase-separated sample (25 vol % MgO-75 vol % $LaMnO_3$)/ $LaMnO_3$/MgO/IBAD MgO/Hastelloy® substrate.

FIG. 7b shows the normalized $J_c$ versus applied field angle for a YBCO film grown on LaMnO$_3$/MgO/IBAD MgO/Hastelloy® substrate and a YBCO film grown on the phase separated sample (25 vol % MgO-75 vol % LaMnO$_3$)/LaMnO$_3$/MgO/IBAD MgO/Hastelloy® substrate. The enhanced $J_c$ peak for H//c for the film on (25 vol % MgO-75 vol % LaMnO$_3$)/LaMnO$_3$/MgO/IBAD MgO/Hastelloy® substrate is reduced indicative of the presence of linear defects aligned along the c-axis of the YBCO film.

While there have been shown and described what are at present considered the preferred embodiments of the invention, it will be obvious to those skilled in the art that various changes and modifications can be prepared therein without departing from the scope of the inventions defined by the appended claims.

What is claimed is:

1. A method for producing a superconducting film containing defects, the method comprising:
    (a) depositing a phase-separable layer epitaxially onto a biaxially-textured substrate, wherein the phase-separable layer comprises at least two phase-separable components; and wherein said phase-separable components have different compositions;
    (b) achieving nanoscale phase separation of the phase-separable layer such that a phase-separated layer comprising at least two phase-separated components is produced; and
    (c) depositing a superconducting film onto said phase-separated components of said phase-separated layer such that nanoscale features of the phase-separated layer are propagated into the superconducting film.

2. The method of claim 1, wherein the defects arise by a crystallographic mismatch between superconducting film grown on one phase-separated component as compared to the crystallographic orientation of superconducting film grown on another phase-separated component, as provided by epitaxial deposition of the superconducting film on the phase-separated components.

3. The method of claim 2, wherein an anti-phase boundary exists between superconducting film grown on one phase-separated component and superconducting film grown on another phase-separated component.

4. The method of claim 2, wherein the crystallographic mismatch arises by a crystallographic difference between superconducting film grown on one phase-separated component and superconducting film grown on another phase-separated component.

5. The method of claim 4, wherein superconducting film grown on one phase-separated component is crystallographically in-plane rotated compared to superconducting film grown on another phase-separated component.

6. The method of claim 4, wherein superconducting film grown on one phase-separated component is polycrystalline while superconducting film grown on another phase-separated component is substantially crystalline.

7. The method of claim 4, wherein superconducting film grown on one phase-separated component is amorphous while superconducting film grown on another phase-separated component is substantially crystalline.

8. The method of claim 1, wherein phase separation of the phase-separable layer occurs during deposition of the phase-separable layer.

9. The method of claim 1, wherein phase separation of the phase-separable layer is induced by an annealing step.

10. The method of claim 1, further comprising adjusting relative concentrations of phase-separable components as a means for modulating a surface density of phase-separated components.

11. The method of claim 10, wherein modulation of the surface density of phase-separated components attain a desired level of defect density in the superconducting film.

12. The method of claim 1, further comprising elongating the defects in the superconducting film in a direction parallel to the substrate surface such that filamentization is produced within the superconducting film.

13. The method of claim 12, wherein the filamentization in the superconducting film is produced by, first, providing a striated phase-separated layer on which the superconducting film is epitaxially deposited.

14. The method of claim 13, wherein the striated phase-separated layer is produced by selectively inducing an edge of the phase-separable layer to phase separate in order to form a seeded edge, and then inducing phase-separation to occur directionally from the seeded edge in a direction away from the seeded edge such that the phase-separated components of the seeded edge become linearly elongated.

15. The method of claim 1, wherein the superconducting film is a high temperature superconducting film.

16. The method of claim 15, wherein the high temperature superconducting film comprises a yttrium barium copper oxide material.

17. The method of claim 15, wherein the high temperature superconducting film comprises a material within the formula (RE)Ba$_2$Cu$_3$O$_7$, wherein RE is a rare earth or transition metal element.

18. The method of claim 17, wherein the material comprises YBa$_2$Cu$_3$O$_7$.

19. The method of claim 15, wherein the high temperature superconducting film comprises a thallium barium calcium copper oxide material.

20. The method of claim 15, wherein the high temperature superconducting film comprises a mercury barium calcium copper oxide material.

21. The method of claim 15, wherein the high temperature superconducting film comprises a bismuth strontium calcium copper oxide material.

22. The method of claim 15, wherein the high temperature superconducting film comprises a lanthanum barium copper oxide material.

23. The method of claim 1, wherein the superconducting film is deposited by a physical vapor deposition technique.

24. The method of claim 23, wherein the physical vapor deposition technique is a pulsed laser deposition technique.

25. The method of claim 1, wherein the superconducting film is deposited by a chemical vapor deposition technique.

26. The method of claim 25, wherein the chemical vapor deposition technique is a molecular-beam chemical vapor deposition technique.

27. The method of claim 1, wherein the biaxially-textured substrate is a rolling assisted, biaxially-textured substrate.

28. The method of claim 1, wherein the biaxially-textured substrate is an ion-beam-assisted deposition substrate.

29. The method of claim 1, wherein the biaxially-textured substrate is an inclined-substrate deposition substrate.

30. The method of claim 1, wherein the phase-separable layer comprises at least one metal oxide component.

31. The method of claim 1, wherein the phase-separable layer comprises at least two metal oxide components.

32. The method of claim 31, wherein the two metal oxide components are independently selected from the group consisting of:
   (i) alkali metal oxide;
   (ii) alkaline earth metal oxide;
   (iii) transition metal oxide;
   (iv) rare earth metal oxide;
   (v) a metal oxide having the formula M'M"O$_3$, wherein M' and M" are independently monovalent, divalent, trivalent, tetravalent, or pentavalent provided that the sum of oxidation states of M' and M" add to +6 to charge balance with oxide atoms; and
   (vi) a metal oxide having the formula M'M"$_2$O$_4$, wherein M' and M" are independently monovalent, divalent, trivalent, tetravalent, or pentavalent, provided that the sum of oxidation states of M' and M" add to +8 to charge balance with oxide atoms.

33. The method of claim 32, wherein one metal oxide component is an alkaline earth metal oxide and the other metal oxide component is a metal oxide having the formula M'M"O$_3$, wherein M' and M" are independently monovalent, divalent, trivalent, tetravalent, or pentavalent provided that the sum of oxidation states of M' and M" add to +6 to charge balance with oxide atoms.

34. The method of claim 33, wherein M' and M" are both trivalent metal ions.

35. The method of claim 33, wherein the metal oxide component having the formula M'M"O$_3$ is the subformula LaM"O$_3$, wherein M" is a trivalent metal ion.

36. The method of claim 33, wherein the metal oxide component having the formula M'M"O$_3$ is LaMnO$_3$.

37. The method of claim 33, wherein the alkaline earth metal oxide component is MgO and the metal oxide component having the formula M'M"O$_3$ is LaMnO$_3$.

38. The method of claim 32, wherein one metal oxide component has the formula M'M"$_2$O$_4$, wherein M' and M" are independently monovalent, divalent, trivalent, tetravalent, pentavalent, or hexavalent, provided that the sum of oxidation states of M' and M" therein add to +8 to charge balance with oxide atoms, and the other metal oxide component has the formula M'M"O$_3$, wherein M' and M" therein are independently monovalent, divalent, trivalent, tetravalent, or pentavalent provided that the sum of oxidation states of M' and M" add to +6 to charge balance with oxide atoms.

39. The method of claim 38, wherein one metal oxide component has the formula M'M"$_2$O$_4$, wherein M' and M" are, respectively, a divalent and trivalent metal ion, and the other metal oxide component has the formula M'M"O$_3$, wherein M' and M" are, respectively, a divalent and tetravalent metal ion.

40. The method of claim 39, wherein the formula M'M"$_2$O$_4$ is the subformula M'Fe$_2$O$_4$ wherein M' is a divalent metal ion.

41. The method of claim 39, wherein the formula M'M"O$_3$ is the subformula M'TiO$_3$ wherein M' is a divalent metal ion.

42. The method of claim 39, wherein the formula M'M"$_2$O$_4$ is the subformula M'Fe$_2$O$_4$, and the formula M'M"O$_3$ is the subformula M'TiO$_3$, wherein M' is a divalent metal ion in both subformulas.

43. The method of claim 39, wherein the metal oxide component having the formula M'M"$_2$O$_4$ is CoFe$_2$O$_4$, and the other metal oxide component having the formula M'M"O$_3$ is BaTiO$_3$.

* * * * *